US012568643B2

(12) United States Patent
Guha et al.

(10) Patent No.: US 12,568,643 B2
(45) Date of Patent: Mar. 3, 2026

(54) NANOWIRE TRANSISTORS AND METHODS OF FABRICATION

(71) Applicant: Intel Corporation, Santa Clara, CA (US)

(72) Inventors: Biswajeet Guha, Hillsboro, OR (US); Brian Greene, Portland, OR (US); Robin Chao, Portland, OR (US); Adam Faust, Portland, OR (US); Chung-Hsun Lin, Portland, OR (US); Curtis Tsai, Beaverton, OR (US); Kevin Fischer, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 927 days.

(21) Appl. No.: 16/914,145

(22) Filed: Jun. 26, 2020

(65) Prior Publication Data

US 2021/0408289 A1     Dec. 30, 2021

(51) Int. Cl.
H10D 30/67     (2025.01)
H10D 30/01     (2025.01)
H10D 30/62     (2025.01)
H10D 64/01     (2025.01)

(52) U.S. Cl.
CPC ....... H10D 30/6213 (2025.01); H10D 30/024 (2025.01); H10D 30/6735 (2025.01); H10D 30/6757 (2025.01); H10D 64/017 (2025.01)

(58) Field of Classification Search
None
See application file for complete search history.

(56)     References Cited

U.S. PATENT DOCUMENTS

| | | | |
|---|---|---|---|
| 2018/0197784 A1* | 7/2018 | Cheng | H01L 29/78696 |
| 2019/0157420 A1* | 5/2019 | Cheng | H01L 29/0673 |
| 2019/0378911 A1* | 12/2019 | Lee | H01L 29/511 |
| 2020/0357911 A1* | 11/2020 | Frougier | H01L 29/42392 |
| 2021/0305408 A1* | 9/2021 | Yu | H01L 21/823842 |

FOREIGN PATENT DOCUMENTS

TW     201606853 A     2/2016

OTHER PUBLICATIONS

Office Action from Taiwanese Patent Application No. 109143941 notified Jun. 27, 2024, 13 pgs.

* cited by examiner

*Primary Examiner* — Sue A Purvis
*Assistant Examiner* — Carnell Hunter, III
(74) *Attorney, Agent, or Firm* — Essential Patents Group, LLP

(57)     ABSTRACT
A transistor structure includes a first channel layer over a second channel layer, where the first and the second channel layers include monocrystalline silicon. An epitaxial source material is coupled to a first end of the first and second channel layers. An epitaxial drain material is coupled to a second end of the first and second channel layers, a gate electrode is between the epitaxial source material and the epitaxial drain material, and around the first channel layer and around the second channel layer. The transistor structure further includes a first gate dielectric layer between the gate electrode and each of the first channel layer and the second channel layer, where the first gate dielectric layer has a first dielectric constant. A second gate dielectric layer is between the first gate dielectric layer and the gate electrode, where the second gate dielectric layer has a second dielectric constant.

14 Claims, 17 Drawing Sheets

200

118     112C     118

204K 114     204F →     ← 204H     204S

204

204R 116     204T     112A     204U     110

206E     $S_{V2}$     $S_{V1}$ 108     206H     206D     206     206B     206F     206A 206G     206C $S_{V4}$     112B     102A 206B     102B $S_{V3}$

102

Y
↑
└→ X

300

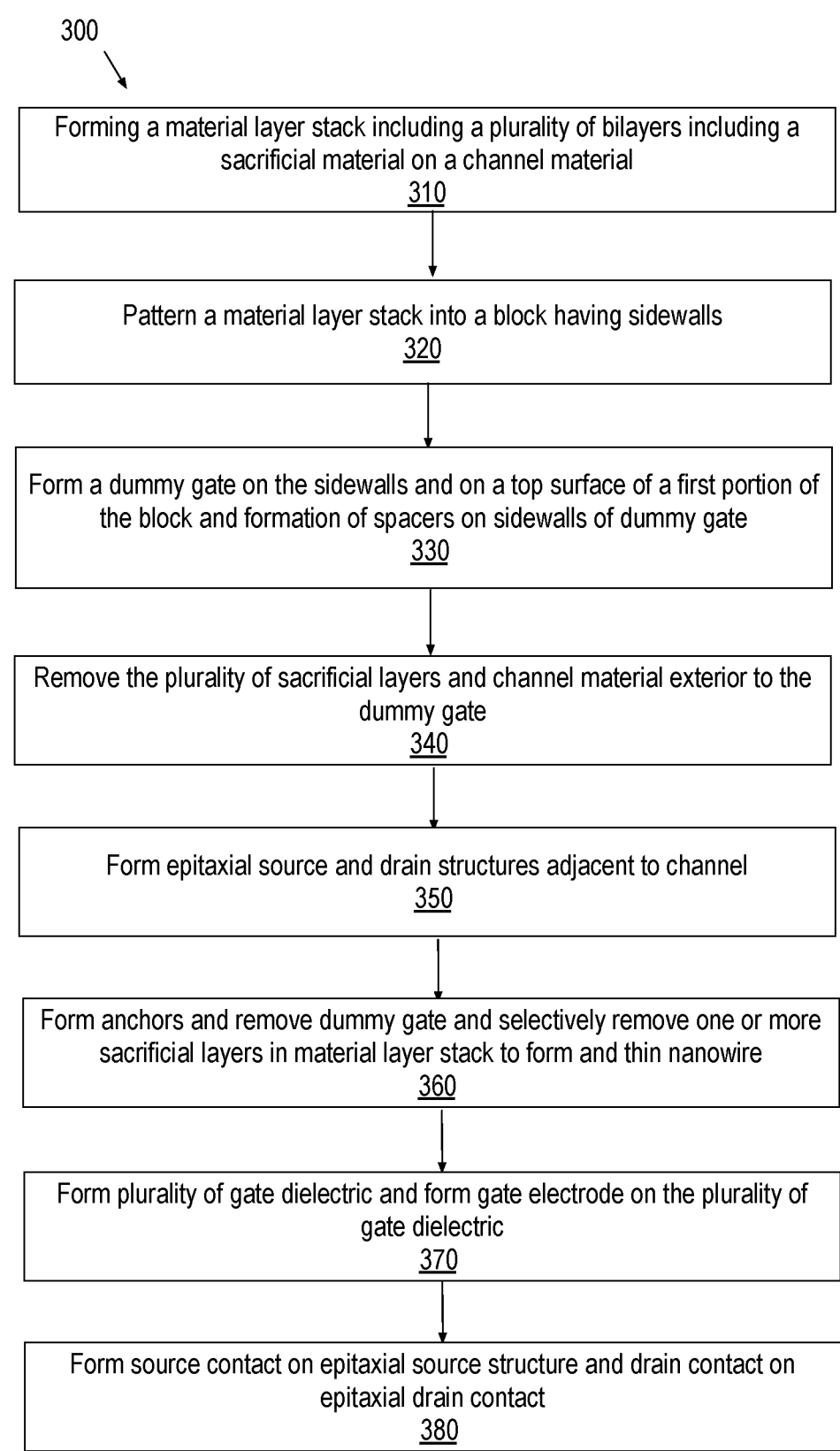

Forming a material layer stack including a plurality of bilayers including a sacrificial material on a channel material
310

Pattern a material layer stack into a block having sidewalls
320

Form a dummy gate on the sidewalls and on a top surface of a first portion of the block and formation of spacers on sidewalls of dummy gate
330

Remove the plurality of sacrificial layers and channel material exterior to the dummy gate
340

Form epitaxial source and drain structures adjacent to channel
350

Form anchors and remove dummy gate and selectively remove one or more sacrificial layers in material layer stack to form and thin nanowire
360

Form plurality of gate dielectric and form gate electrode on the plurality of gate dielectric
370

Form source contact on epitaxial source structure and drain contact on epitaxial drain contact
380

FIG. 3

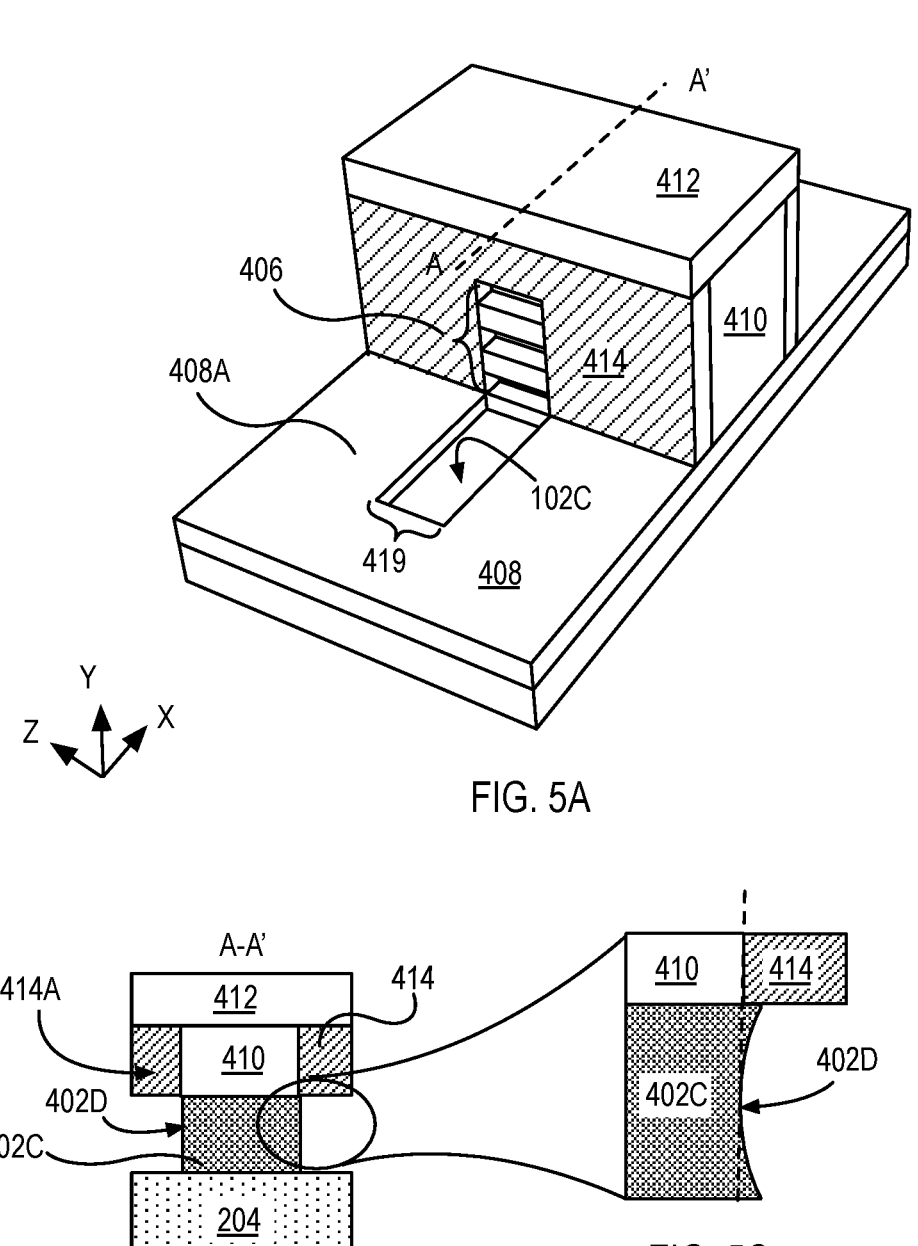
FIG. 5A
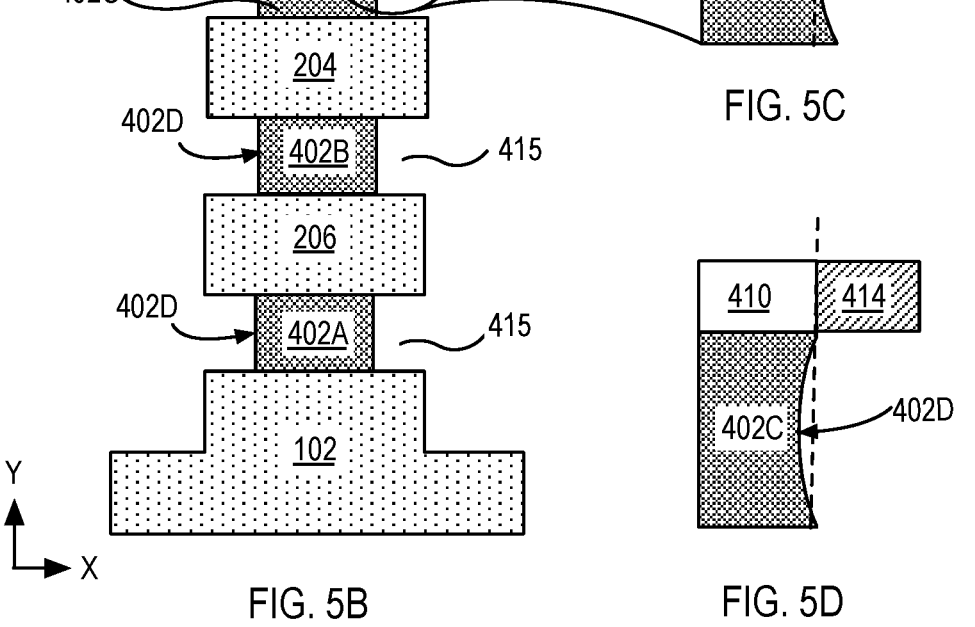
FIG. 5B
FIG. 5C
FIG. 5D

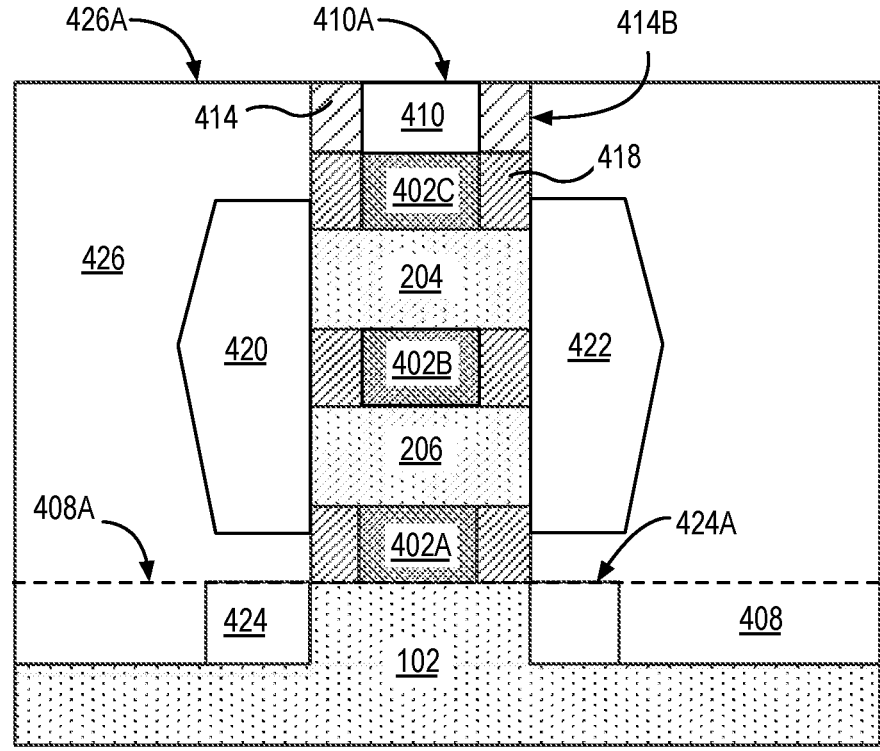
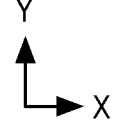
FIG. 8

NANOWIRE TRANSISTORS AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of devices on a chip, lending to the fabrication of products with increased functionality. Scaling of such transistors which include silicon channels becomes more challenging when device metrics such as off state leakage, subthreshold slope or gate control for example, become adversely affected. Silicon nanowire-based transistor offers a pathway to scale dimensions of silicon-based transistors while improving gate control and mitigating issues such as off-state leakage current. While a transistor gate dielectric layer including high-K materials have been advantageous for scaling to sub 10 nm feature sizes, high voltage applications may benefit from a gate dielectric layer that is substantially thicker than those utilized in logic transistors. However, integrating nanowire transistors for high voltage devices on a same substrate as those for high performance logic transistors can be challenging because of vertical space limitations between nanowires.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2D is a cross-sectional illustration of a first nanowire transistor having reduced channel thickness and thick gate dielectric layer adjacent to the nanowire, and a second a nanowire transistor without reduced channel thickness and a less thick gate dielectric layer, in accordance with an embodiment of the present disclosure.

FIG. 3 is a method to fabricate a nanowire transistor such as illustrated in FIG. 2A, in accordance with an embodiment of the present disclosure.

FIG. 5A illustrates the structure of FIG. 4E following the process to remove the sacrificial layer from under the dielectric spacer.

FIG. 5B is a cross-sectional illustration of a portion of the structure of FIG. 4E, along a line A-A'

FIG. 5C is an enhanced cross-sectional illustration of a portion of the structure of FIG. 5B, illustrating effect of etch on sidewall surfaces.

FIG. 5D is an enhanced cross-sectional illustration of a portion of the structure of FIG. 5B, illustrating effect of etch on sidewall surfaces.

FIG. 8 illustrates the structure of FIG. 7A following the formation of a dielectric on the raised source structure and the raised drain structure and on an isolation region.

DESCRIPTION OF THE EMBODIMENTS

Figure 1A:
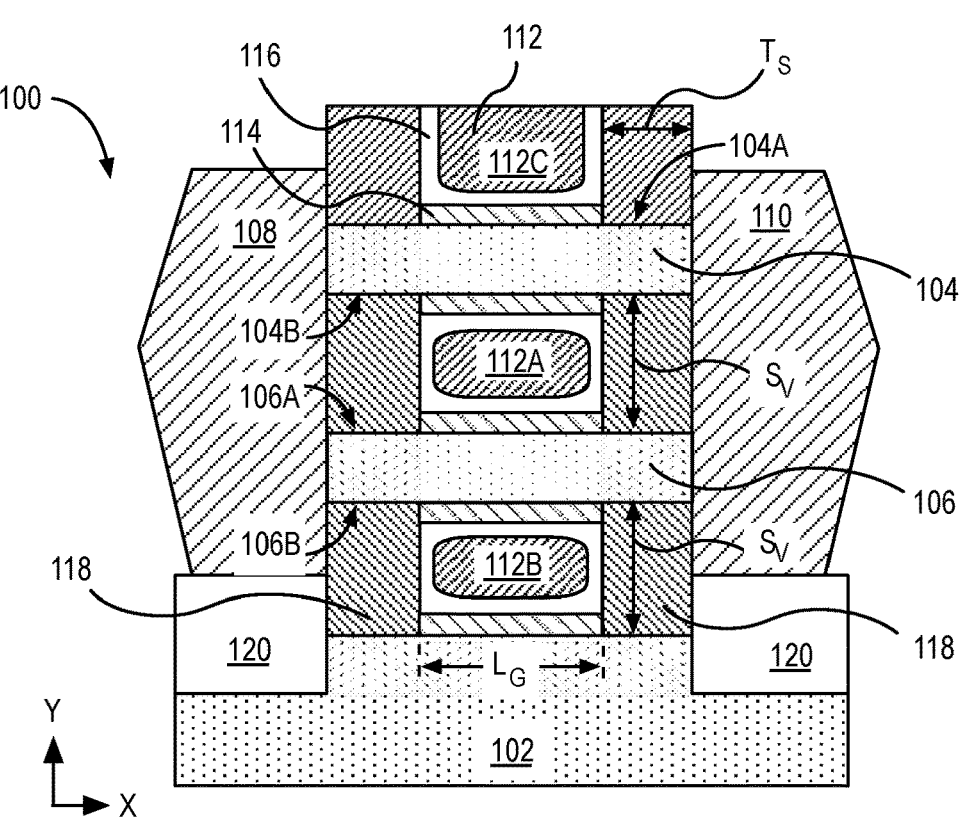
FIG. 1A is a cross-sectional illustration of a transistor including a plurality of nanowires formed above a substrate, in accordance with an embodiment of the present disclosure.

Nanowire transistors and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with group III-N transistor, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/-10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

To enable scaling in silicon channels, transistor architecture such as nanowire and stacked nanowires have been adopted. Nanowire transistors provide benefits such as near ideal sub-threshold slopes, low leakage current and less degradation of mobility with gate voltage compared to other transistor architectures. Nanowire transistors have been integrated with high-K gate dielectric materials such as oxides of hafnium, zirconium, lanthanum etc. to enable gate control in logic devices.

In integrated circuit applications, analog I/O devices may be integrated with logic nanowire devices on a same substrate. Such analog I/O devices may operate at substantially higher voltages than logic transistors. Operation at higher voltages (greater than or equal to 1.2V, for example) may result in dielectric breakdown when analog I/O devices include one or more gate dielectric layers having insufficient thicknesses. For example, a gate dielectric layer thickness that is substantially the same as a thickness of a gate dielectric layer utilized in low voltage logic transistors (less than 0.8V, for example) may be in adequate for high voltage applications.

One method to support nanowire transistors for analog I/O devices is to increase the thickness of the gate dielectric layer. However, silicon nanowire channels are fabricated by removing a plurality of sacrificial layers above and below each layer of silicon in a material layer stack. For practical reasons, the sacrificial layers have a thickness that is comparable to or less than a thickness of each layer of silicon. In embodiments, a vertical spacing between successive layers of silicon may be as little as 7-10 nm. In implementations where a thickness of the one or more gate dielectric layers is as much as 2.0 nm, a space for formation of a gate electrode may be less than 4 nm.

The inventors have found that in long channel devices operating at 1.2V [VCC], a gate dielectric combination, including a layer of high-K gate and a layer silicon dioxide, has a thickness of as much as 4 nm on each surface of the silicon nanowire. While a high-K dielectric in principle may be thickened, practical considerations such as degradation in quality of crystalline high-K film may limit a thickness to be less than or equal to 1.5 nm, for example. Hence, increasing a thickness of a silicon dioxide layer may be required to support high voltage operation.

While increasing a thickness of the sacrificial layer may be possible, factors such as aspect ratio and patterning fidelity may limit this number. In some examples, a transistor may include 4-5 nanowires that are each 15 nm wide and between 7-9 nm tall. In some such examples, the aspect ratio of a material layer stack from which the nanowire may be fashioned, may be as much as 5:1, when each sacrificial layer is between 8 to 10 nm tall.

When the number of nanowire channels are less than 4, for example, taller sacrificial layers may be implemented. However, the inventors have found that to implement thicker gate dielectric stacks and greater than 4 nanowires, the thicknesses of each nanowire may be reduced in the active channel region. Furthermore, the thickness of the silicon nanowires may be preferentially reduced in analog devices enabling co-fabrication with logic devices.

In accordance with an embodiment of the present disclosure a transistor includes a plurality of channel layers arranged in a vertically stacked formation, where each of the plurality of channel layers are separate from each other. In one embodiment, a transistor includes a first channel layer over a second channel layer, where the first and the second channel layers comprise a monocrystalline silicon. The transistor further includes an epitaxial source material coupled to a first end of the first and second channel layers and an epitaxial drain material coupled to a second end of the first and second channel layers. A gate electrode is between the source material and the drain material and between the first channel layer and the second channel layer. The transistor further includes a first gate dielectric layer between the gate electrode and each of the first channel layer and the second channel layer, the first gate dielectric layer having a first dielectric constant, and a second gate dielectric layer between the first gate dielectric layer and the gate electrode, where the second gate dielectric layer has a second dielectric constant. In exemplary embodiments, the first gate dielectric layer includes a material such as silicon dioxide or silicon oxide, and the second gate dielectric layer includes a material having a high dielectric constant such as hafnium oxide, zirconium oxide, lanthanum oxide, etc. The dielectric constant of silicon oxide is less than 4 and the dielectric constant of a high-K material may be at least 20.

The first channel layer may be vertically spaced apart from the second channel layer by at most 10 nm to facilitate a combined thickness of the first and second dielectric layers of up to 3.5 nm and a gate electrode between the first and second channel layers.

In addition to a plurality of silicon nanowire channels, when the substrate includes bulk silicon, the transistor may further include a non-nanowire channel below the plurality of nanowires, where the non-nanowire channel may be a gated on at least 2 sidewalls.

The source material and the drain material may extend close edges of the gate dielectric to minimize external resistance of the nanowire transistor. The gate electrode may be spaced apart from the source material or drain material by as little as a few nanometers.

FIG. 1A is a cross-sectional illustration of a transistor 100 above a substrate 102. The transistor 100 includes a channel layer 104 over a channel layer 106, where the channel layer 104 and channel layer 106 include a monocrystalline silicon. The transistor 100 further includes epitaxial source material 108 (herein source epi 108) coupled to a first end of the channel layer 104 and channel layer 106 and a epitaxial drain material 110 (herein drain epi 110) coupled to a second end of the channel layer 104 and channel layer 106, as shown. A gate electrode 112 is between the source contact 108 and the drain contact 110. The gate electrode 112 is between the channel layer 104 and channel layer 106 and around the channel layer 104 and channel layer 106. The transistor 100 further includes a plurality of gate dielectric layers. As shown, the transistor 100 includes a gate dielectric layer 114 and a gate dielectric layer 116. In the illustrative embodiment, gate dielectric layer 114 is between the gate electrode 112 and channel layer 104 and channel layer 106, and gate dielectric layer 116 is between the gate dielectric layer 114 and the gate electrode 112. A plurality of gate dielectric layers such as gate dielectric layers 114 and 116 provide an insulator thickness that is sufficient for the transistor 100 to operate at over 1.2V. An operating voltage of 1.2V facilitates a long channel or wide gate length transistor for analog I/O applications. In embodiments, the transistor 100 has a gate length, $L_G$, that is between 50 nm and 100 nm.

In an embodiment, where the channel layers 104 and 106 include silicon, the gate dielectric layer 114 includes silicon and oxygen. The gate dielectric layer 114 may have a substantially uniform thickness across the channel layer 104 or 106 as shown. In an embodiment, the gate dielectric layer 114 has a thickness between 1.6 nm and 2.2 nm. The gate dielectric layer 114, including a material such as silicon dioxide, has a dielectric constant less than 4. In an exemplary embodiment, gate dielectric layer 116 includes a high-K material. The gate dielectric layer 116 has a dielectric constant that is at least 5 times greater than a dielectric constant of gate dielectric layer 114. The gate dielectric layer 116 may have a substantially uniform thickness across upper and lower surfaces 104A, and 104B, respectively of channel layer 104 and across upper and lower surfaces 106A, and 106B, respectively of channel layer 106 as shown. In an embodiment, the gate dielectric layer 116 has a thickness between 1.2 nm and 2.0 nm. The thickness of gate dielectric layer 114 and choice of material and thickness of gate dielectric layer 116 may be determined by a minimum break down voltage. In an exemplary embodiment, the gate dielectric layer 116 includes HfO2 where the thickness of the HfO2 gate dielectric layer 116 is between 1.1 nm and 2.0 nm. In embodiments, a combined thickness of a silicon dioxide gate dielectric layer 114 and a HfO2 gate dielectric layer 116 is less than 4 nm.

As shown in the Figure, channel layer 104 has a lowermost surface 104A that is spaced apart from an uppermost surface 106A of the channel layer 104 by a distance, $S_V$. Also as shown, channel layer 104 has a lowermost surface 106B that is spaced apart from an uppermost surface 102A of the substrate 102, by a distance, $S_V$. In embodiments, $S_V$ ranges between 8 nm and 15 nm is sufficiently thick to support a combined thickness of the gate dielectric layers 114 and 116 adjacent to surfaces 104A and 106A and a gate electrode 112 in between as shown in the Figure.

Figure 1B:
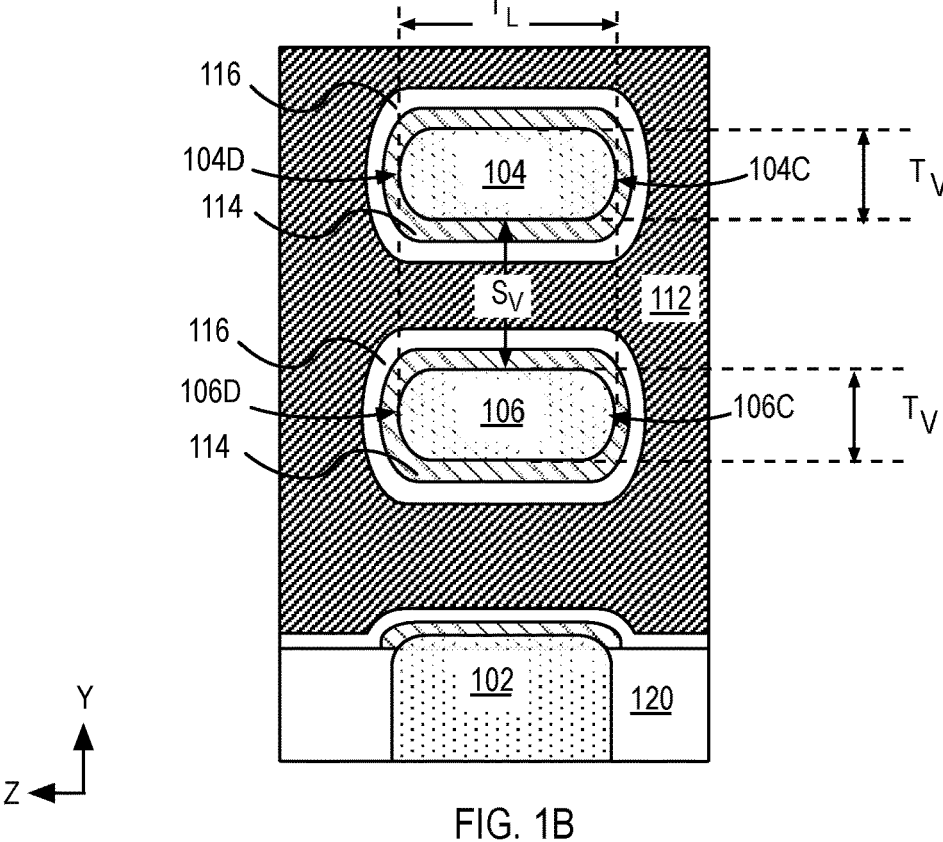
FIG. 1B is a cross-sectional illustration of the structure in FIG. 1A taken along a line A-A'.

FIG. 1B is a cross sectional illustration of a portion of the structure in FIG. 1A, through a line A-A'. As shown, channel layer 104 and channel layer 106 each have a vertical thickness, $T_V$, along a first direction (Y-axis) that is orthogonal to a longitudinal length (along X-axis). As shown, channel layer 104 and channel layer 106 each have a lateral thickness, $T_L$, along a second direction (Z-axis). In an embodiment, $T_V$, is between 5 nm and 8 nm and wherein the $T_L$, is between 15 nm and 19 nm. In an embodiment, the cross-sectional area of channel layers 104 and 106, as shown in the Figure, is at least 30 nm². In some embodiments, the channel layer 104 has a lateral thickness, $T_L$, that is less than a lateral thickness, $T_L$, of the channel layer 106. In embodiments, the difference in lateral thicknesses is less than 10%.

In some embodiments, the channel layer 104 has a vertical thickness, $T_V$, that is less than a vertical thickness, $T_V$, of the channel layer 106. In embodiments, the difference in vertical thicknesses is less than 10%. In the illustrative embodiment, channel layer 104 and channel layer 106 are rectangular with rounded corners. In other embodiments channel layer 104 and channel layer 106 have a substantially rectangular profile. As shown in the cross-sectional illustration, channel layer 106 has a first sidewall 104C and a second sidewall 104D opposite to sidewall 104C, and channel layer 106 has a first sidewall 106C and a second sidewall 106D opposite to sidewall 106C.

In the illustrative embodiment, gate dielectric layer 114 surrounds channel layer 104 and channel layer 106. As shown, gate dielectric layer 114 is also directly adjacent to sidewalls 104C and 104D of channel layer 104 and directly adjacent to sidewalls 106C and 106D of channel layer 106. In some embodiments, gate dielectric layer 114 has a uniform thickness on sidewalls 104C and 104D and on 106C and 106D. It is to be appreciated that a thickness of the gate dielectric layer 114 on sidewall 104C may be different than a thickness of the gate dielectric layer 114 on sidewall 104D, and that that a thickness of the gate dielectric layer 114 on sidewall 106C may be different than a thickness of the gate dielectric layer 114 on sidewall 106D. In embodiments, the difference in thickness is less than 10%.

In the illustrative embodiment, the gate dielectric layer 116 is substantially conformal with the gate dielectric layer 114, where the gate dielectric layer surrounds channel layer 104 and channel layer 106. In embodiments, the gate dielectric layer 116 is conformal to within 10% around the gate dielectric layer 114.

In the illustrative embodiment, the gate electrode 112 surrounds each of channel layer 104 and channel layer 106. Depending on the thickness of the gate dielectric layer 114 and gate dielectric layer 116, the gate electrode has a thickness between 3 nm and 7 nm in the space between the channel layer 104 and channel layer 106.

In embodiments, a high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer 116 include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Referring again to FIG. 1A, there may be more than one or more dielectric materials adjacent to gate dielectric layers 114 and 116. In the illustrative embodiment, the transistor 100 includes a dielectric spacer 118 between gate dielectric layers 114 and 116 and the source epi 108 and the dielectric spacer 118 between gate dielectric layers 114 and 116 and drain epi 110. In an embodiment, the dielectric spacer has a lateral thickness, $T_S$. In embodiments, $T_S$ is at least 5 nm but can be as much as 10 nm.

As shown, an interface between the dielectric spacer 118 and the gate dielectric layers 114 and 116 is substantially vertical. In other embodiments, the interface may be concaved or convex. In some embodiments, a second dielectric spacer is present directly above and in contact with the dielectric spacer 118. The second dielectric spacer may include a same material or a different material than a material of the dielectric spacer 118. In an embodiment, the dielectric spacer 118 includes silicon and nitrogen and/or carbon.

In the illustrative embodiment, the source epi 108 and drain epi 110 are directly adjacent to the channel layer 104 and channel layer 106. In the illustrative embodiment, the source epi 108 and drain epi 110 are separated from the substrate 102 by a dielectric 120. In an embodiment, the dielectric 120 includes silicon and at least one of oxygen, nitrogen and/or carbon. In an exemplary embodiment, dielectric 120 includes silicon, oxygen and carbon or silicon and carbon. In an embodiment, the source epi 108 and drain epi 110 each include a doped semiconductor material. In embodiments the source epi 108 and drain epi 110 include epitaxial SiGe that is doped with boron. As shown the dielectric spacer 414 prevents the source epi 108 and drain epi 110 from contacting the gate electrode above the channel 104.

In an embodiment, the gate electrode 112 includes one or more layers, where a first layer in contact with the gate dielectric layer 116 is a work function electrode and a second layer in contact with the first is a fill metal. Depending on $S_V$, some gate electrode portions such as gate electrode portion 112A (between channels 104 and 106) and gate electrode portion 112B (below channel layer 106) may only include a work function electrode, while gate electrode portions 112C may include a work function electrode and a fill metal. As shown, a top surface of gate electrode portion 112C is not bounded by gate dielectric layers 114 or 116.

In an embodiment, gate electrode 112 includes a metal such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, or hafnium carbide, zirconium carbide, titanium carbide, tantalum carbide, and aluminum carbide.

In an embodiment, the substrate 102 includes single crystal silicon, or a multilayer stack including silicon, SiGe on silicon, germanium on silicon, or III-V materials. In some embodiments, the substrate 102 is a silicon on insulator stack, where 102 includes a layer of silicon on a layer of silicon dioxide above a layer of silicon. The substrate 102 may or may not be doped with.

While two channels, such as channel layer 104 and channel layer 106 are shown, in other examples, transistor 100 can include up to 5 channels. A larger number of channels can increase a drive current of transistor 100.

In other examples when a logic transistor is adjacent to a long channel transistor, it may not be possible to implement a thicker gate oxide on a long channel transistor while implementing a thinner gate oxide on a short channel transistor. Furthermore, if the number of channels is increased, the spacing between channels may not exceed more than 10 nm. In such examples, the portion of the channel layer 104 and 106 between dielectric spacer 118 (FIG. 1A) may be preferentially narrowed in both X-Y and Y-Z planes in the analog devices, while preserving the channels in a logic device. Narrowing down the channels 104 and 106 may permit implementation of a thicker gate dielectric stack such as a stack of gate dielectric layer 116 on gate dielectric layer 114.

Figure 2A:
FIG. 2A is a cross-sectional illustration of a transistor including a plurality of nanowires having a reduced cross-sectional area in the midplane compared to cross sectional areas at two opposite ends, in accordance with an embodiment of the present disclosure.

FIG. 2A is a cross-sectional illustration of a transistor 200 where channels 204 and channels 206 have variable thicknesses along a longitudinal direction (x-axis).

Figures 2B, 2C:
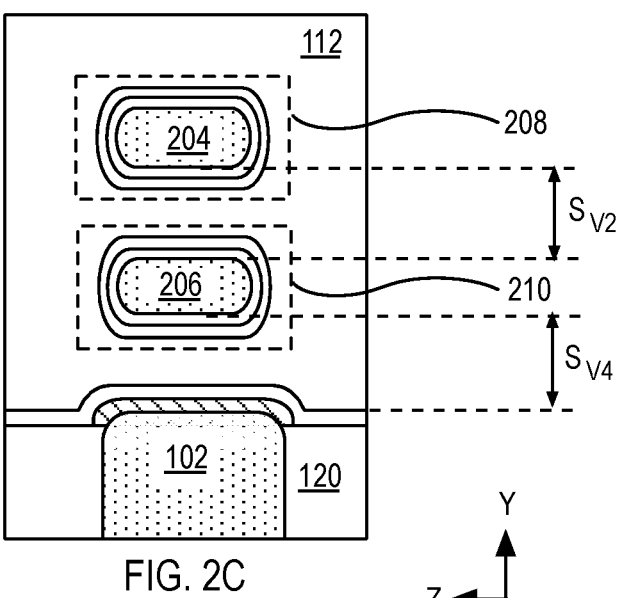
FIG. 2B is an isometric illustration of a portion of a nanowire illustrated in FIG. 2A.
FIG. 2C cross-sectional illustration along the line A-A' of the structure in FIG. 2A, illustrating a plurality of gate dielectric layers around each of the plurality of nanowire channels and a gate electrode in contact with an outermost gate dielectric layer.

FIG. 2B is an isometric illustration of a channel 204 that includes a first tapered section 204A decreasing in thickness from a first thickness, $H_1$, to a second thickness, $H_2$, along a longitudinal direction (X-axis) and a second tapered section 204B increasing in thickness from the second thickness, $H_2$, to the first thickness, $H_1$, along the longitudinal direction (X-axis). The channel 204 further includes a bridge section 204C between the tapered sections 204A and 204B, where the bridge section 204C has substantially the second thickness, $H_2$. In an embodiment, $H_1$ is at least 10 nm and less than 20 nm and $H_2$ is at least 5 nm but less than 10 nm. In other embodiments, differences between $H_1$ and $H_2$ is within 50%.

The tapered sections 204A and 204B each span a lateral distance, $L_1$ and $L_2$, respectively, along a longitudinal length (X-axis) of the channel 204. $L_1$ and $L_2$, may vary with embodiments. In exemplary embodiments, $L_1$ and $L_2$, are substantially the same. In embodiments $L_1$ and $L_2$ are between 2 nm and 10 nm. In embodiments, the bridge section 204C spans a lateral distance, $L_3$ that is between 4 nm and 90 nm. In an embodiment, bridge section 204C spans a lateral distance, $L_3$ that is 90% greater than each of the lateral distances, $L_1$ or $L_2$, of the first or the second tapered sections.

In the illustrative embodiment, the section 204C of the channel 204 has a minimum width, $W_1$. In an exemplary embodiment, $W_1$ is substantially the same across the longitudinal length of the bridge section 204C. In embodiments, tapered section 204A has a width that varies along the longitudinal length of the channel 204. As shown, width of tapered section 204A increases from $W_1$ to $W_2$, in a direction away from the bridge section 204C to the end of section 204A. Similarly, in embodiments, tapered section 204B also has a width that varies along the longitudinal direction of the channel 204. As shown, width of tapered section 204B increases from $W_1$ to $W_2$, in a direction away from the bridge section 204C to the end of section 204B. In an embodiment, $W_2$ is at least 13 nm and less than 25 nm and $W_1$ is at least 10 nm but less than 19 nm. In other embodiments, differences between $W_1$ and $W_2$ (lateral displacement approximately $2*W_S$) is less than 50%. The lateral displacement, $W_S$, of the tapered section 204B and 204A will depend on $W_2$ and $W_1$.

While features of a channel having variable thickness and width have been described in relation to channel 204, channel 206 (not shown in FIG. 2B) has substantially the same features as the channel 204. It is to be appreciated that while channels 204 and 206 have substantially the same channel length, $L_C$, minimum and maximum channel widths, indicated by $W_1$ and $W_2$ may vary between channels 204 and 206 by as much as 25%. Channel 206, for example, may have a larger $W_1$ and $W_2$ than channel 204.

The channel 204 further includes channel portions 204D and 204E that are under spacer 118 (not shown in the Figure) Channel portion 204D is adjacent to tapered section 204A and channel portion 204E is adjacent to tapered section 204B. In the illustrative embodiment, each of the channel portions 204D and 204E have a thickness $H_1$ and a width $W_1$.

As shown in the isometric illustration, the tapered section 204A includes tapered surfaces 204F and 204G and tapered section 204B includes tapered surfaces 204H and 204J. In embodiments, such as is shown, the bridge section 204C has a substantially planar surface 204K. Surface 204K is recessed with respect to uppermost surfaces 204M and 204N of the channel portions 204D and 204E, respectively. In embodiments, a recess in surface 204K with respect to surfaces 204M or 204N is approximately equal to half the difference in numerical value between heights $H_2$ and $H_1$.

Sidewall surface 204L is laterally recessed with respect to surface 204P and 204Q. In embodiments, a recess in surface 204L with respect to surfaces 204P or 204Q is approximately equal to half the difference in numerical value between lateral widths $W_2$ and $W_1$. In some embodiments, sidewall surface 204L is curved, as is shown. In other embodiments, sidewall surface 204L is substantially planar.

While not shown in the illustration, gate dielectric layer 114 is in direct contact with surfaces 204F, 204G, 204H, 204J, 204K, and 204L. It is to be appreciated that surfaces of channel 204 not visible in the illustration, but directly opposite to each of the surfaces 204F, 204G, 204H, 204J, 204K, and 204L also have one or more respective features of the corresponding surfaces 204F, 204G, 204H, 204J, 204K, and 204L.

While not shown, channel 206 has one or more features that are the same or substantially the same as features of channel sections 204A, 204B, 204C, 204D and 204E. In exemplary embodiments, the material of channel 204 and 206 is the same or substantially the same as the material of the channels 104 or 106.

Referring again to FIG. 2A, transistor 200, has one or more features of the transistor 100. As shown, channels 204 and 206 are separated by a vertical distance that varies along a longitudinal direction of the channels 204 and 206.

The channels 204 and 206 have a minimum and a maximum vertical separation $S_{V1}$ and $S_{V2}$ respectively. In the illustrative embodiment, lowermost surface 204R of channel 204 and uppermost surface 206A of channel 206 have a minimum distance of separation, $S_{V1}$. In some embodiments, $S_{V1}$ is at least 8 nm. It is to be appreciated that surfaces 204R and 206A are within the boundary of the dielectric spacer and are not in contact with the gate dielectric layers 114 and 116. In embodiments, $S_{V1}$ is at least greater than two times a combined thickness of the gate dielectric layer 114, gate dielectric layer 116.

In the illustrative embodiment, surface 204S of channels 204 and surface 206B of channel 206 have a maximum distance of separation, $S_{V2}$. In some embodiments, $S_{V2}$ is between 10 nm and 15 nm. In embodiments, $S_{V2}$ is at least greater than two times a combined thickness of the gate dielectric layer 114, gate dielectric layer 116 and a nominal thickness of the gate electrode portion 112A. The nominal thickness of the gate electrode portion 112A is an amount of gate electrode material that is sufficient to create a transverse electric field in the channels 204 and 206, respectively. In embodiments, the thickness of the gate electrode portion 112A is at least 1 nm. In other embodiments, the thickness of the gate electrode portion 112A is at least 1 nm but less than 10 nm.

The channel 206 and the substrate 102 have a minimum and a maximum vertical separation. In the illustrative embodiment, the surfaces 206C of channel 206 and uppermost surface 102A of substrate 102 have a minimum distance of separation, $S_{V3}$. In some embodiments, $S_{V3}$ is at least 10 nm. It is to be appreciated that surface 206C is within the boundary of the dielectric spacer 118 and is not in contact with the gate dielectric layers 114 and 116. In embodiments, $S_{V3}$ is at least greater than two times a combined thickness of the gate dielectric layer 114, gate dielectric layer 116.

In the illustrative embodiment, surface 206D of channels 206 and recessed surface 102B of substrate 102 has a maximum distance of separation, $S_{V4}$. In some embodiments, $S_{V4}$ is at least 15 nm. In embodiments, $S_{V4}$ is at least greater than two times a combined thickness of the gate dielectric layer 114, gate dielectric layer 116 and a nominal thickness of the gate electrode portion 112B. The nominal thickness of the gate electrode portion 112B is an amount of gate electrode material that is sufficient to create a transverse electric field in the channel 206.

In the cross-sectional illustration, the gate dielectric layer 114 is substantially conformal with the shape of the channel 204 and all surfaces, 204F, 204H, 204K, 204S, 204T and 204U of the channel 204 between the dielectric spacer 118. In the cross-sectional illustration, the gate dielectric layer 114 is substantially conformal with the shape of the channel 206 and all surfaces, 206B, 206E, 206F, 206G, 206D and 206H of the channel 206 between the dielectric spacer 118.

As show the gate dielectric layer 116 is substantially conformal with the gate dielectric layer 114 and sidewalls of the spacer 118. The gate electrode portions 112A, 112B and 112C are adjacent to the gate dielectric layer 116. In the illustrative embodiment, gate electrode portions 112A and 112B are substantially thinner than gate electrode portion 112C. As shown, a top surface of gate electrode portion 112C is not bounded by gate dielectric layers 114 or 116.

FIG. 2C is a cross-sectional illustration through a vertical axis of the transistor 200 in FIG. 2A. Bridge sections 204C of channel 204 and a corresponding bridge section of channel 206 below bridge section 204C are illustrated in the Figure. The spatial separation $S_{V2}$ and $S_{V4}$ are indicative of a maximum separation between channels 204 and 206 and between channel 206 and substrate 102. Dashed lines 208 and 210 represent a maximum cross-sectional area of the channels 204 and 206 under dielectric spacer 118, (not shown in the Figure).

FIG. 3 is a method 300 to fabricate a transistor such as transistor 200 in accordance with an embodiment of the present disclosure. The method 300 begins at operation 310 with the formation of a material layer stack including a plurality of bilayers of a layer of a sacrificial material on a layer of monocrystalline silicon. The method 300 continues at operation 320 with patterning of the material layer stack into a block. The method 300 continues at operation 330 with the formation of a dummy gate on a first portion of the block and on sidewalls of the block and formation of spacers on sidewalls of dummy gate. The method 300 continues at operation 340 with removal of the layer of sacrificial material and removal of each layer of monocrystalline silicon from the plurality of bilayers external to the dummy gate structure. The method 300 continues at operation 350 with the formation of epitaxial source and epitaxial drain structures adjacent to the remaining adjacent to the layer of monocrystalline silicon in the plurality of bilayers within the spacers. The method 300 continues at operation 360 with formation of anchors on the epitaxial source and epitaxial drain structures, removal of the dummy gate structure, and formation of nanowires. The method 300 continues at operation 370 with the formation of a gate structure in the first portion on the nanowires. The method concludes at operation 380 with the formation of source and drain contacts on the epitaxial source and epitaxial drain structures, respectively.

Figures 4A, 4B, 4C:
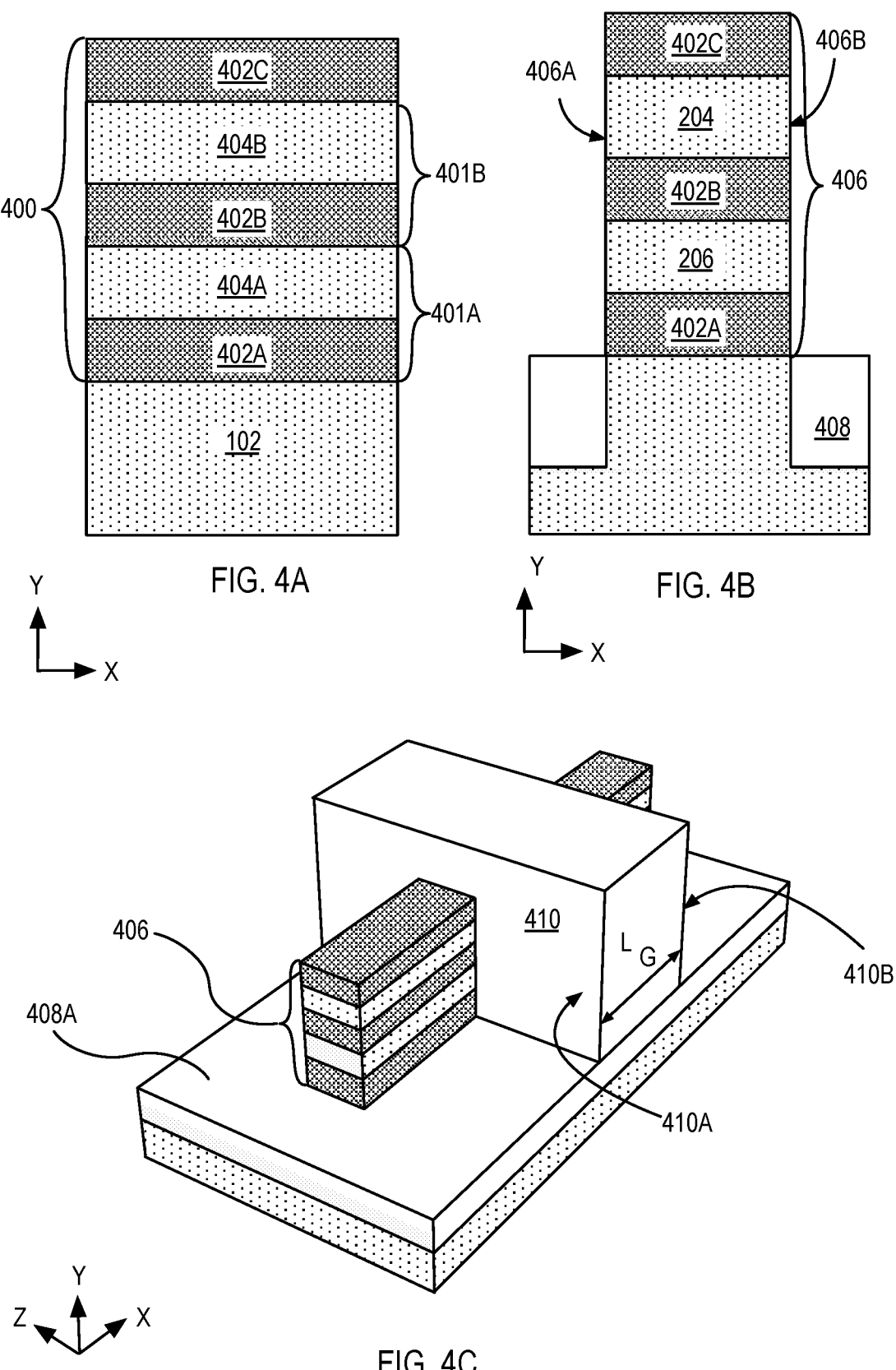
FIG. 4A is an cross-sectional illustration of material layer stack for fabrication of a nanowire transistor device, where the material layer stack includes a plurality of bilayers, where each of the bilayer includes a sacrificial layer on a monocrystalline silicon, in accordance with an embodiment of the present disclosure.
FIG. 4B is a cross sectional illustration of a block formed by patterning the material layer stack.
FIG. 4C is an isometric illustration following the formation of a dummy gate structure formed on a first portion of the block.

FIG. 4A is an cross-sectional illustration of material layer stack 400 for fabrication of an analog nanowire transistor device, in accordance with an embodiment of the present disclosure.

In an embodiment, a material layer stack 400 having a plurality of bilayers is formed on the substrate 102. In the illustrative embodiment, forming the material layer stack 400 includes formation of a bilayer 401A followed by formation of bilayer 401B on bilayer 401A. In an exemplary embodiment, bilayer 401A includes a first sacrificial layer 402A and a second layer 404A which includes monocrystalline silicon, herein silicon layer 404A, on the layer 402A. Bilayer 401B includes a second sacrificial layer 402B and a second layer 404B which includes monocrystalline silicon on the layer 402B. In the illustrative embodiment, the bilayer 401B is capped by a sacrificial layer 402C.

In an embodiment, sacrificial layers 402A, 402B and 402C include silicon and germanium such as $Si_{1-x}Ge_x$, where X is between 0.3-0.35. In at embodiment, the sacrificial layers are doped to increase wet etch removal rates relative to silicon. In an exemplary embodiment, sacrificial layer 402A can be grown epitaxially on the substrate 102 to follow the crystal orientation of the substrate 102. In an embodiment, the substrate 102 includes silicon where the silicon substrate has a top surface having a (001) crystal plane.

The layer 404A is formed on layer 402A, where layer 404A includes a material of the channel 204 or channel 206. In an embodiment, the silicon is a (001) silicon In an embodiment, the process to grow the materials in the bilayer 401A is repeated until a desired number of silicon channel layers are formed within a Si/SiGe superlattice stack 400.

The thickness of the material layer stack 400 may be limited by an aspect ratio of a fin structure, for example, after patterning of the material layer stack 400. For a given total thickness of the material layer stack 400, individual thickness of the sacrificial layers 402A, 402B and 402C may be limited by a minimum thickness required of the layers 404A and 404B. However, the thickness of the sacrificial layers 402A, 402B and 402C determine the spacing between channels that will be formed in a downstream process. In embodiments, the sacrificial layer 402A is grown to a thickness between 10 nm and 15 nm. Depending on embodiments, silicon layer 404A has a thickness that is between 7 nm and 15 nm.

In an embodiment, the material layer stack 400 is a Si/SiGe super lattice, where the super lattice material layer stack 400 is formed by a reduced pressure CVD process. It is to be appreciated that the deposition process minimizes $Si_{1-x}Ge_x$, strain relaxation to enable longitudinal strain in transistor channels that are to be subsequently formed.

In the illustrative embodiment, a bilayer 401B is formed on the silicon layer 404A of bilayer 401A. The layer 402B in the bilayer 401B is epitaxially formed on silicon layer 404A. The thickness of the layer 402B may or may not be equal to the thickness of the layer 402A. In an exemplary embodiment, the silicon layers 404A and 404B are substantially the same, i.e., they both include a same material and have a same or substantially the same thickness, as is shown in FIG. 4A. The material layer stack 400 further includes a layer 402C formed on the bilayer 401. While two bilayers 401A and 401B are shown, the number of bilayers can be between 2-10.

FIG. 4B is a cross sectional illustration of a block 406 formed by patterning the material layer stack 400 (shown in FIG. 4A). In an embodiment, prior to patterning a mask is formed on the topmost layer 402C that defines a shape and size of the block 406. In an embodiment, a plasma etch process may be utilized to pattern and form the block 406. The plasma etch forms channels 204 and 206. In exemplary embodiments, the sidewalls 406A and 406B may be substantially vertical as shown. It is to be appreciated that when the sidewall profiles 406A are substantially vertical, the lateral width of each channel layer that will be subsequently be formed may have substantially a same lateral dimension (defined by the space between the sidewall 406A and 406B). The patterning process carried out etches a portion of the substrate 102. The etch process is halted after etching a desired amount of silicon.

After formation of block 406, a dielectric 408 is formed on the block 406 and on sidewalls of the block 406. The dielectric 408 is then polished until a top surface of the dielectric 408 is substantially coplanar with a top surface of the dielectric. In an embodiment, a chemical mechanical polish (CMP) process is utilized to planarize the dielectric. The dielectric 408 may be then recessed to a level at or below the uppermost surface 102A of the substrate 102 as shown. In an embodiment, a wet etch process is used to recess the dielectric 408.

FIG. 4C is an isometric illustration following the formation of a dummy gate structure 410 formed on a first portion of the block 406. In an embodiment, a dummy gate dielectric layer such as silicon oxide, or Al2O3, is blanket deposited on the block 406 and on the dielectric 408 and a sacrificial material is deposited on the dummy gate dielectric.

In an embodiment, the dummy gate material includes a mask on sacrificial material. A plasma may be utilized, for example, to pattern the mask and sacrificial material and dummy gate material into dummy gate structure 410. In an exemplary embodiment, the plasma etch process is selective to an uppermost surface 408A of the dielectric 408. In an embodiment, the dummy gate structure 410 has sidewalls 410A and 410B that are substantially vertical relative to an uppermost dielectric surface 408A. The dummy gate structure 410 has a lateral width, $L_G$. $L_G$ defines a width of a transistor gate that is to be formed.

Figure 4D:
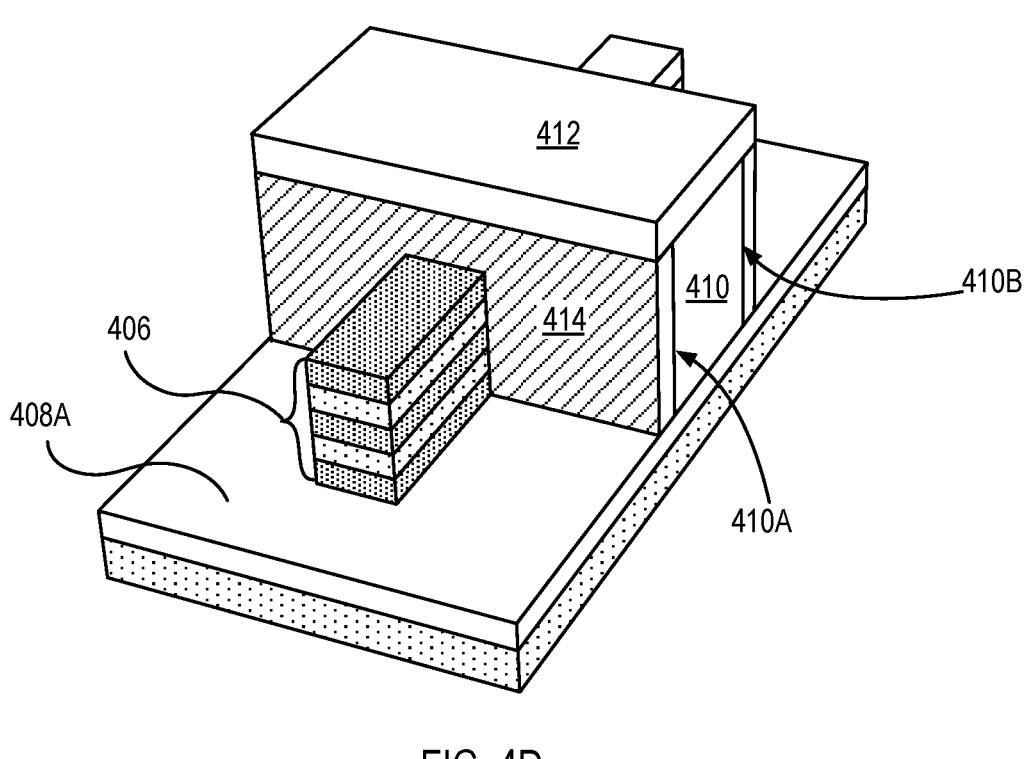
FIG. 4D is an isometric illustration of the structure in FIG. 4C following the formation of a dielectric spacer adjacent to the dummy gate structure.

FIG. 4D is an isometric illustration of the structure in FIG. 4C following the formation of a dielectric spacer 414 adjacent to the dummy gate structure 410. In an embodiment, a dielectric spacer layer is blanket deposited on the block 406 and on the dummy gate structure 410 and on sidewalls 410A and 410B. The deposition process utilized may include a PECVD (plasma enhanced chemical vapor deposition), physical vapor deposition (PVD), chemical vapor deposition (CVD) process. In an embodiment, the dielectric spacer layer includes silicon and nitrogen and/or carbon.

In an embodiment, the dielectric spacer layer is planarized. The planarization process may expose an uppermost surface of the dummy gate structure 410. As shown, a mask 412 is formed over the dummy gate structure 410 and over a portion of the dielectric spacer layer. The dielectric spacer layer is etched to form dielectric spacer 414. A plasma etch may be utilized to pattern the dielectric spacer 414. An over etch of the dielectric spacer layer is carried out to remove the dielectric spacer layer from sidewall portions of the block 406 that are not covered by the mask.

In the illustrative embodiment, the dielectric spacer 414 is formed on sidewall portions of the block 406 directly adjacent to the dummy gate structure 410. As shown, the dummy gate structure 410 and the dielectric spacer 414 both cover portions of the sidewalls of the block 406.

The dielectric spacer 414 may be formed to a thickness that is determined by downstream process, electrical performance requirements (such as modulation of external resistance) or a combination thereof. In an embodiment, the dielectric spacer 414 has a lateral width between 5 nm to 10 nm.

Figure 4E:
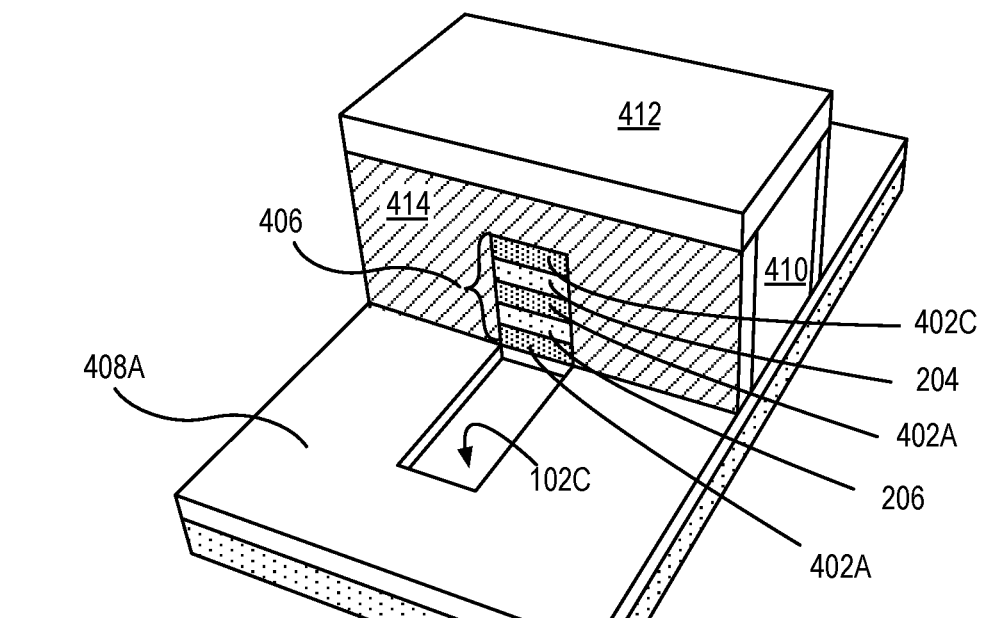
FIG. 4E illustrates the structure of FIG. 4D following process to etch portions of the material layer stack not covered by the spacer or the dummy gate structure.

FIG. 4E illustrates the structure of FIG. 4D following the process to etch portions of the block 406 that are exterior to the dielectric spacer 414. In an embodiment, a plasma etch process is utilized to etch the layers within block 406. In an embodiment, after the plasma etch process etches the lower most layer 402A, an uppermost portion of the substrate 102 is partially etched. In an embodiment, surface 102C is recessed below surface 408A of dielectric 408.

In embodiments, where the layers 402A includes SiGe the plasma etch process may recess portions of the layers 402A, 402B and 402C selective to channels 204 and 206 under the dielectric spacer 414. In embodiments where the substrate includes a silicon on insulator, the opening 419 exposes a buried oxide.

FIG. 5A illustrates the structure of FIG. 4E following the process to recess portions of the sacrificial layer in the material layer stack 400 under the dielectric spacer 414. In an embodiment, a plasma etch, wet chemical etch, or a combination thereof is utilized to recess the sacrificial layers in the material layer stack 400.

FIG. 5B is a cross-sectional illustration of the structure in FIG. 5A through the line A-A'. In the illustrative embodiment, sacrificial layers 402A, 402B and 402C are removed from a region directly under the spacer. Removal of the sacrificial layers 402A, 402B and 402C forms plurality of recesses 415, as shown. The plurality of recesses 415 expose upper, lower and sidewall surfaces of the channel 204 and channel 206, as shown.

In exemplary embodiments, sidewalls 402D of each of the sacrificial layers 402A, 402B and 402C are aligned with an inner sidewall 414A of the dielectric spacer 414, as shown. As shown the sidewalls 402D are substantially vertical. In other embodiments, the sidewalls 402D are concaved. In some embodiments, a concaved sidewall 402D is under a portion the dielectric spacer 414, as shown in the enhanced cross-sectional illustration of FIG. 5C. In other embodiments, a concaved sidewall 402D is under a portion of the dummy gate 410 as shown in the enhanced cross-sectional illustration of FIG. 5D. It is to be appreciated that sidewalls 402D of each of the sacrificial layers 402A, 402B and 402C may not all be vertically aligned with each other.

While the sacrificial layers 402A, 402B and 402C are removed in a subsequent downstream operation, the shapes of sidewalls 402A, 402B and 402C may influence the shapes of a dielectric spacer that will be formed in the plurality of recesses 415. The shapes of sidewalls 402A, 402B and 402C may also influence profiles/shape of the high-K dielectric that will be formed directly adjacent to the dielectric spacer in a downstream operation.

Figure 6A:
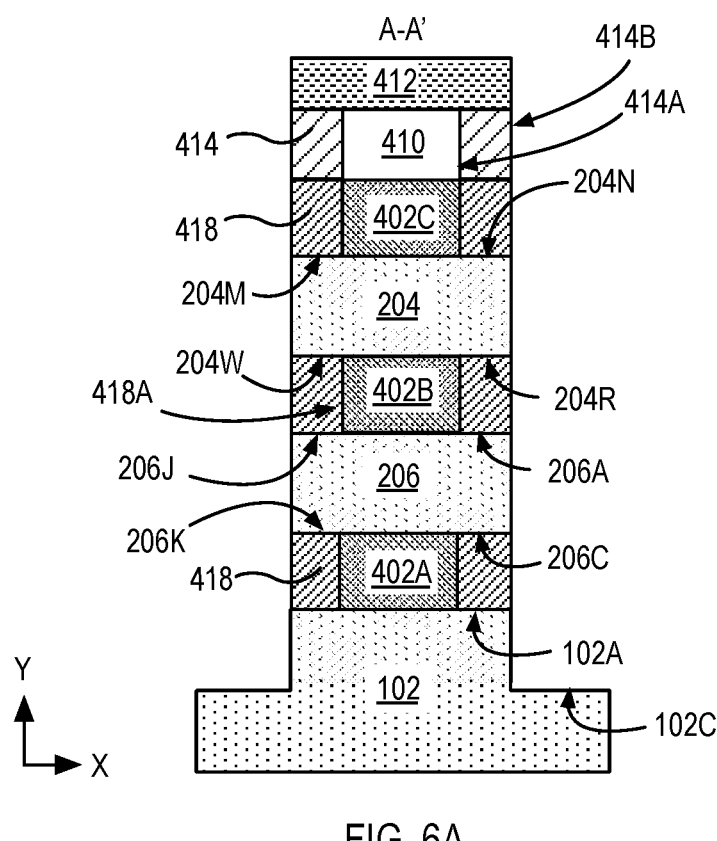
FIG. 6A illustrates the structure of FIG. 5B following the process to backfill the region vacated by removal of the sacrificial layer.

FIG. 6A illustrates the structure of FIG. 5B, following the formation of sidewall spacers 418 adjacent to sacrificial layers 402A, 402B and 402C. In an embodiment, a dielectric spacer material is deposited using an atomic layer deposition (ALD), PVD PECVD or a CVD process. In an embodiment, the spacer is deposited to a thickness that is greater than a lateral thickness of the dielectric spacer 414. In an exemplary embodiment, the dielectric spacer material includes a material of the dielectric spacer 414. In other embodiments, the dielectric spacer material includes silicon and one or more of nitrogen, carbon or oxygen. In an exemplary embodiment, the dielectric spacer material is deposited uniformly in the openings 415, on or adjacent to surfaces 204M, 204N, 204W, and 204R of channel 204, on or adjacent to surfaces 206A, 206C, 206J and 206K of channel 206 and on surfaces 102A and 102C of the substrate 102. The dielectric spacer material is also deposited on sidewalls 414B of spacer 414, sidewalls of the channels 204 and 206, on the mask 412.

After deposition the dielectric spacer material is etched by a plasma etch process. In an embodiment, portions of the dielectric spacer material deposited on sidewalls of the dielectric spacer 414, sidewalls of the channels 204 and 206, deposited on sidewalls of substrate 102 and on surface 102C are etched and removed. The process of etching forms dielectric spacer 418 as shown.

As discussed above, while the sacrificial layers 402A, 402B and 402C were removed in an prior operation, the shapes of sidewalls 402A, 402B and 402C may influence the shape of dielectric spacer 418 formed. In other embodiments, the dielectric spacer 418 has one or more sidewalls 418A that are concaved (not shown). Furthermore, the one or more sidewalls 418A may extend beyond inner spacer sidewall 414A under the dummy gate structure 410.

Figure 6B:
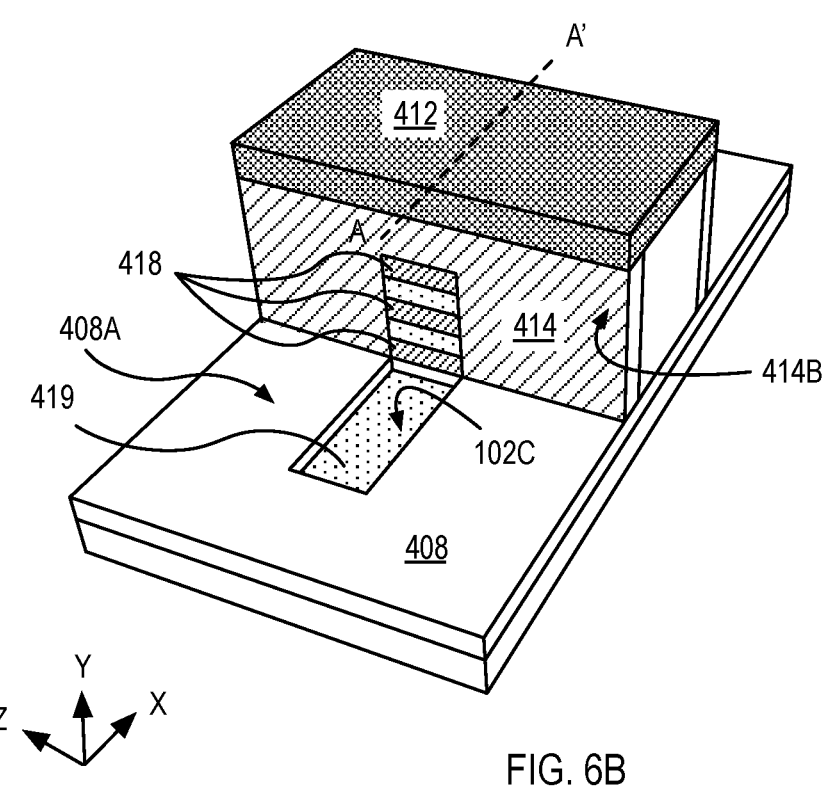
FIG. 6B is an isometric illustration of the structure of FIG. 6A.

FIG. 6B is an isometric illustration of the structure in FIG. 5A following the formation of the dielectric spacer 418 in the plurality of recesses 415. The dielectric spacer material is also deposited and etched off dielectric surface 408A. It is to be appreciated that portions of the dielectric spacer 418 may remain in the opening 419 adjacent to the dielectric 408. In embodiments where the substrate 102 includes a silicon on insulator, the opening 419 exposes a buried oxide. In an embodiment, the mask 412 is also removed during formation of the dielectric spacer 418.

Figure 7A:
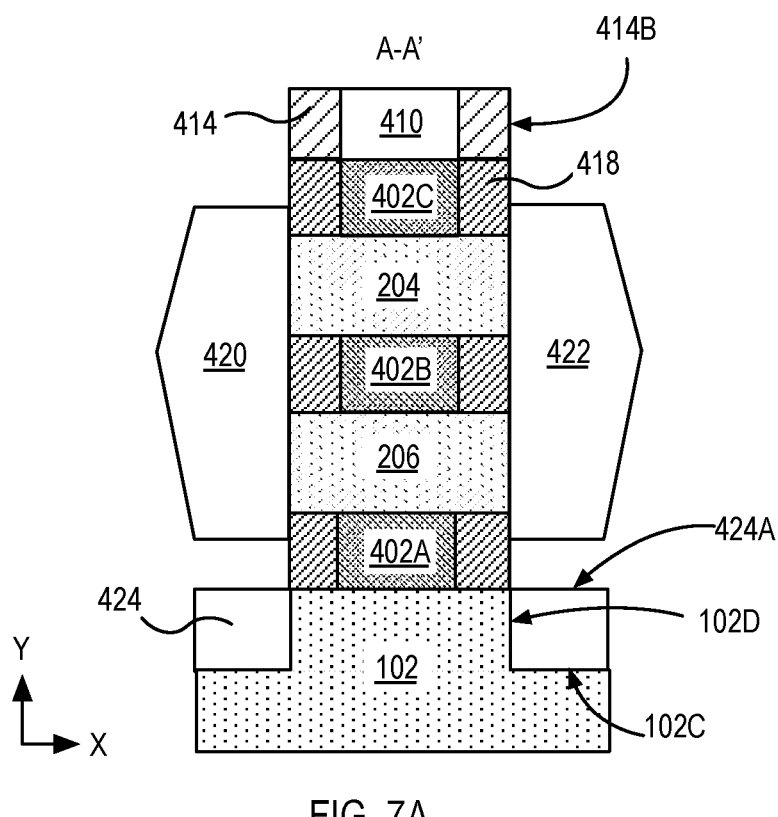
FIG. 7A illustrates the structure of FIG. 6A following the formation of a raised source structure and a raised drain structure.

FIG. 7A illustrates the structure of FIG. 6A following the formation of source and drain epitaxial structures 420 and 422. In an embodiment, a dielectric 424 is deposited on the surface 102C and sidewall 102D of the substrate. The dielectric may be blanket deposited on the structure of FIG. 6A, planarized and then recessed, for example. In an embodiment, the mask 412 (not shown) is removed during the planarization process. In other embodiments the mask 412 is removed at a later operation. In embodiments dielectric has an uppermost surface 424A that is at a level of the uppermost surface 102A or above the surface 102A.

In an embodiment, the source and drain epitaxial structures 420 and 422 are epitaxially grown by a reduced pressure CVD (RPCVD) process. In an embodiment, the source epitaxial structure 420 and drain epitaxial structure 422, is growth to have faceted sidewalls, such as is illustrated. In PMOS embodiments, the source and drain epitaxial structures include $Si_{1-x}Ge_x$, where X is between 0.3-0.35, and $p^+$ dopants such as boron, gallium, indium, aluminum. In exemplary embodiments, the $Si_{1-x}Ge_x$ source and drain epitaxial structures 420 and 422 are grown to have compressive strain. In NMOS embodiments, source epitaxial structure 420 and drain epitaxial structure 422 include silicon having a tensile strain, and n-dopants such as phosphorus or arsenic.

In the illustrative embodiment, the source epitaxial structure 420 and drain epitaxial structure 422 are formed adjacent to sidewalls of channel 204 and channel 206 and adjacent to dielectric spacer 418, as shown. In some embodiments, the source epitaxial structure 420 and drain epitaxial structure 422 may contact the dielectric surface 424A As shown, the source epitaxial structure 420 and drain epitaxial structure 422 is separated from dielectric surface 424A by at least a portion of a vertical thickness of sacrificial layer 402A.

In embodiments where the dielectric 424 is absent, the vertical thickness of the sacrificial layer 402A may be increased to prevent contact between the source epitaxial structure 420 and drain epitaxial structure 422, and the surface 102C.

Figure 7B:
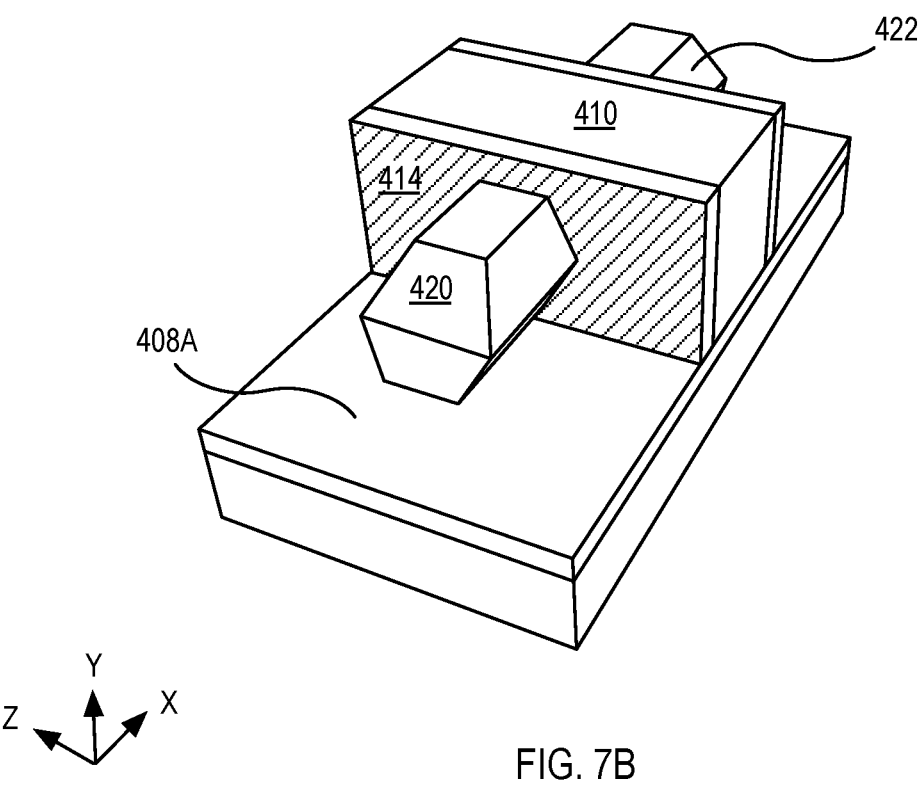
FIG. 7B is an isometric illustration of the structure in FIG. 7A.

FIG. 7B is an isometric illustration of the structure in FIG. 6B following the formation of the source epitaxial structure 420 and drain epitaxial structure 422. As shown, the source epitaxial structure 420 and drain epitaxial structure 422 have trapezoidal shapes and are above and separated from the dielectric surface 408A.

FIG. 8A is a cross-sectional illustration of the structure in FIG. 7A following the formation of a dielectric 426. In the illustrative embodiment, the dielectric 426 is formed on the source epitaxial structure 420 and on the drain epitaxial structure 422, on dielectric spacer 414, and on uppermost surface 410A of the dummy gate structure 410 on dielectric surface 424 and on the dielectric surface 408A. In an embodiment, the dielectric 426 is deposited by a blanket deposition process using a physical vapor deposition (PVD) or a chemical vapor deposition (CVD) process. In an embodiment, a chemical mechanical polish (CMP) process is utilized to planarize the dielectric 426 which forms an uppermost surface 426A that is substantially planar, as shown. In an embodiment, a mask portion of the dummy gate material is removed by the CMP process to facilitate removal of the dummy gate structure.

Figure 9A:
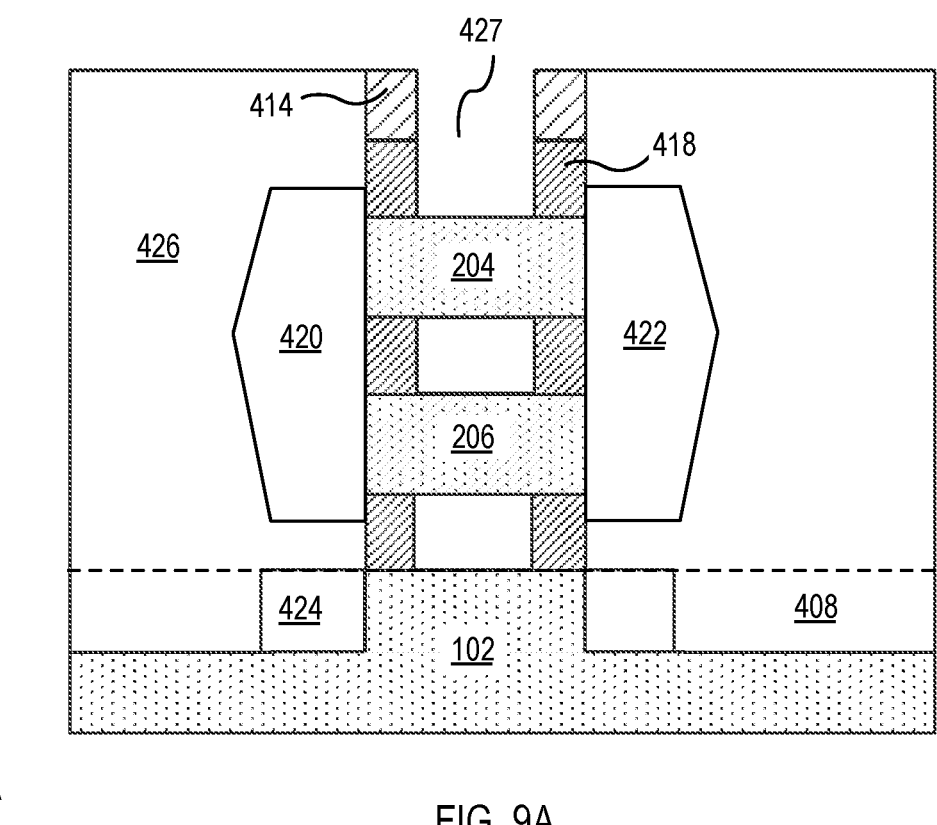
FIG. 9A illustrates the structure of FIG. 8 following the process to remove the dummy gate structure and portions of the sacrificial layer that are exposed after removing the dummy gate structure.

FIG. 9A illustrates the structure of FIG. 8A following the process to remove the dummy gate structure 410 and the sacrificial layers 402A, 402B and 402C exposed after removing the dummy gate structure 410.

In an embodiment, where the dummy gate structure 410 includes a dummy gate material such as polysilicon, silicon germanium, germanium, a combination of plasma etch, and wet chemical etch can be utilized to remove the dummy gate structure 410. Removal of the dummy gate structure 410 does not affect the channels 204 or 206 because of the presence of a dummy gate dielectric under the dummy gate material (as described in association with FIG. 4C).

Removal of the dummy gate structure 410 forms an opening 427 as illustrated. In an embodiment, removal of the dummy gate structure 410 does not appreciably alter the lateral width of the dielectric spacer 414 or spacer 418.

In an embodiment, a wet chemical process is utilized to remove the sacrificial layers 402A, 402B and 402C. The wet etch chemistry may selectively etch 402A, 402B and 402C with respect to a dummy gate dielectric layer on channel 204 and 206, dielectric spacer 414 and 418, and dielectric 426.

Figure 9B:
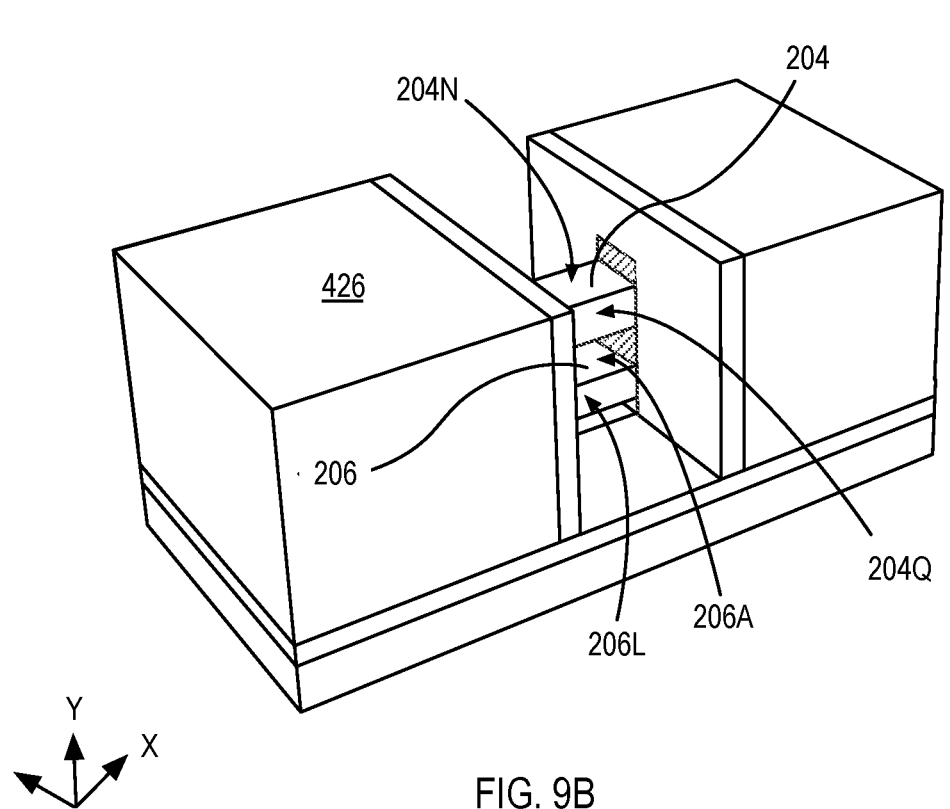
FIG. 9B is an isometric illustration of the structure in FIG. 9A.

FIG. 9B is an isometric illustration of the structure illustrating the suspended channels 204 and 206. It is to be appreciated that the dummy gate dielectric material (not shown) is on sidewalls 204Q and 206Q of channels 204 and 206, respectively. The dummy gate material is not on the surfaces 204N or 206A. Surfaces 204N or 206A are exposed after removal of the sacrificial layers 402C and 402B.

Figure 10A:
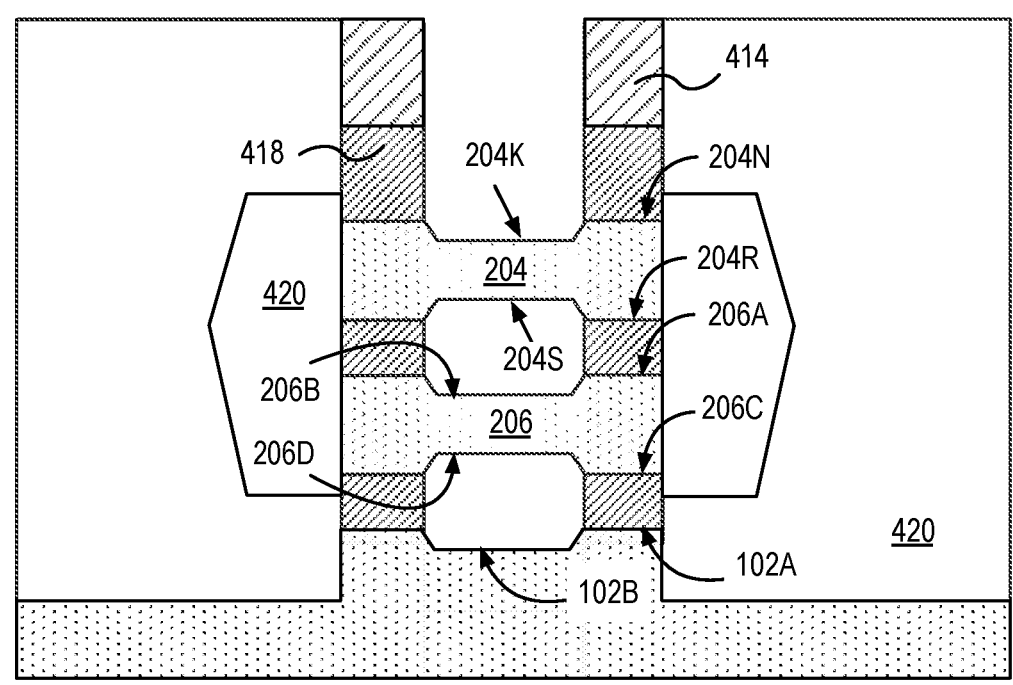
FIG. 10A is a cross-sectional illustration of the structure in FIG. 7 after the process to reduce a vertical thickness of each of the plurality of nanowires, in accordance with an embodiment of the present disclosure.

FIG. 10A is a cross-sectional illustration of the structure in FIG. 9A following the process to form recesses in the channels 204 and 206. In an embodiment, a vapor etch process is utilized to etch exposed surface portions of the channel layer 204 and 206. In other embodiments, a combination of a plasma etch process and a wet chemical process is utilized, where the plasma etch is highly isotropic. In one or more of the embodiments described, the etch is highly selective to dielectric spacers 414 and 418. The shape of the channels 204 and 206 after recessing have been described above in association with FIGS. 2A and 2B.

In an embodiment, the surfaces 204K and 204S of channel 204, and surfaces 206B and 206D of channel 206 are recessed by the etch process simultaneously. In the illustrative embodiment, surfaces 204K and 204S are recessed relative to surfaces 204N and 204R, and surfaces 206B and 206D are recessed relative to surfaces 206A and 206C. As shown surface 102B of the substrate 102 is also recessed relative to surface 102A.

Figure 10B:
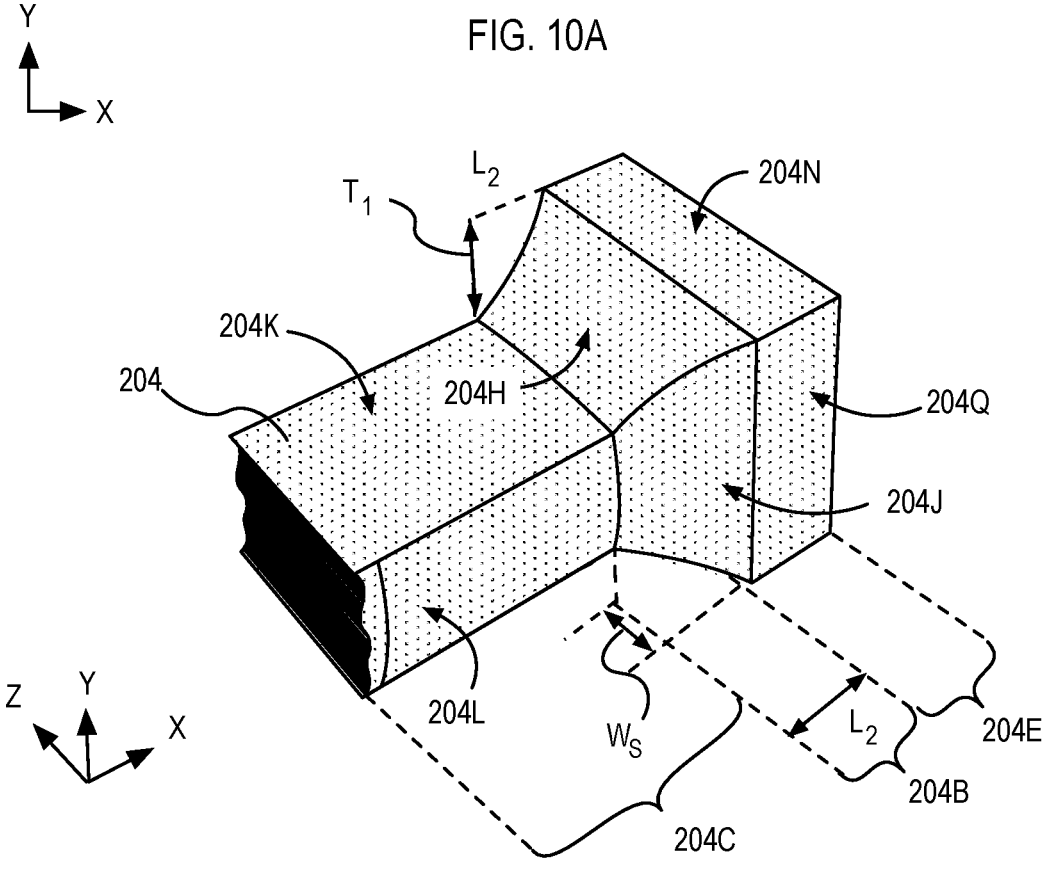
FIG. 10B is an isometric illustration of a portion of a nanowire depicted in FIG. 9A.

FIG. 10B is an isometric illustration of a portion of channel 204. In the illustrative embodiment, surface 204K is recessed relative to surface 204N which is under dielectric spacer 418 (not shown), and surface 204L is recessed relative to surface 204Q which is adjacent to dielectric spacer 414 (not shown). Surfaces 204Q and 204N are protected by the dielectric spacers 414 and 418, respectively during the recessing process and are thus not recessed.

In an embodiment, the processing operations leading up to removal of the sacrificial layers 402C and 402B form a layer of silicon and oxygen on various exposed surfaces of the channel 204. In an embodiment, the layer includes silicon dioxide and can be removed by a wet chemical etch. As such some surfaces on the channel have a rounded cross-sectional profile such as surface 204L whereas, surface 204K is substantially flat.

Depending on the etch process utilized, the lateral displacement, $L_2$, and lateral displacement, $W_S$, of the tapered section 204B may increase or decrease. Furthermore, because different surfaces may have a different crystal planes, the etch rates on some surfaces may be greater than others. Thus, surface 204K and surface 204L may recess at different rates or be susceptible to different oxidation rates. The lateral displacement, $W_S$, of the tapered section 204B and 204A will depend on $W_2$ and $W_1$ (discussed above in association with FIG. 2B.)

Surface 204H may also have a different level of taper compared to surface 204J because of surface passivation on sidewall surfaces of the channel 204 compared to upper and lower surfaces.

In one or more embodiments, channel 206 has surface features that are substantially similar to surface features of channel 204 described above in association with FIG. 10B because etch processes simultaneously etch and shape channels 204 and 206.

In some process embodiments, a silicon oxidation process is carried out to thicken a silicon oxide formed around the channels 204 and 206. Such an oxidation process may result in channels 204 and 206 surfaces being recessed at substantially uniform rates.

Figure 11A:
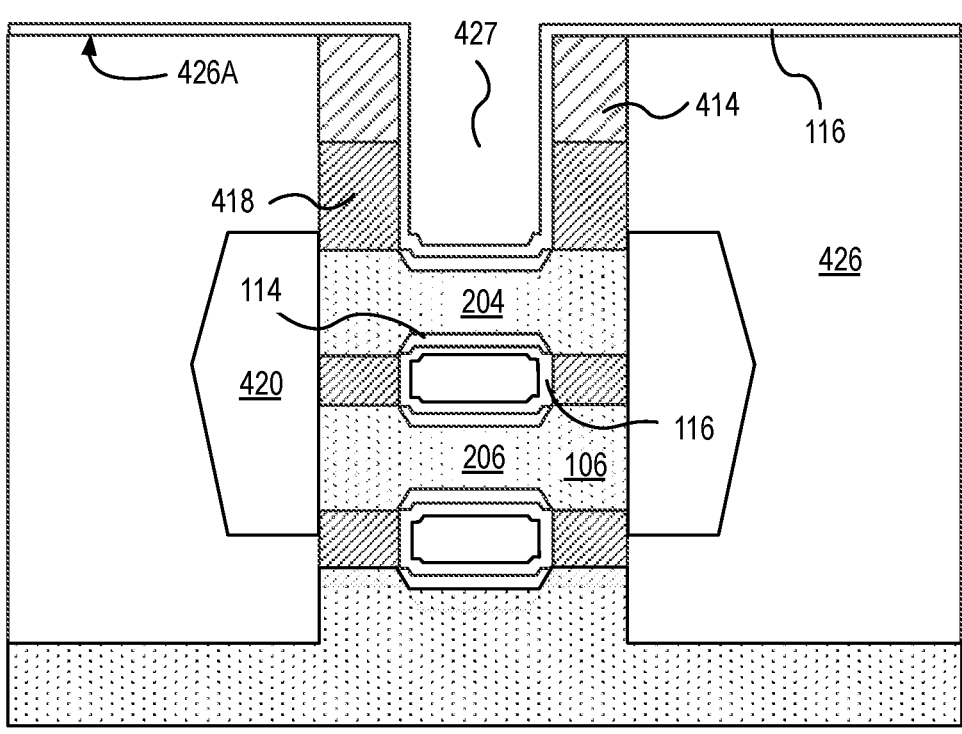
FIG. 11A illustrates the structure of FIG. 10A following the formation of a first gate dielectric layers on each of the plurality of nanowires, followed by the formation of a second gate dielectric layer on the first gate dielectric layer.

FIG. 11A is a cross-sectional illustration of the structure in FIG. 10A following the process to form gate dielectric layers 114 and 116.

In an embodiment, gate dielectric layer 114 is formed by an oxidation process of the channels 204 and 206. In an embodiment, after the recess process, a layer of silicon dioxide may be grown on the exposed surfaces of the channel 204 and 206. In the illustrative embodiment, the gate dielectric layer 114 is not formed on sidewall surfaces of the spacer 414 or 418. The process may favor a highly isotropic growth of silicon dioxide around the channel 204 and 206. Depending on embodiments, the silicon dioxide may be grown to different thicknesses. In an embodiment, gate dielectric layer 114 is formed to a thickness of 1.5 nm to 2.2 nm.

In an embodiment, the process to deposit gate dielectric layer 116 is performed without breaking vacuum. In other embodiments, the gate dielectric layer 116 is deposited by an ALD process. An ALD process not facilitates coverage of gate dielectric layer 116 on surfaces that are not in a vertical line of sight. As shown, gate dielectric layer 116 may be blanket deposited on all exposed surfaces within the opening 427. In the illustrative embodiment, the gate dielectric layer 116 is formed on sidewalls of spacers 414 and 418, and on the gate dielectric layer 114 and on an uppermost surface 426A of dielectric 426.

Figure 11B:
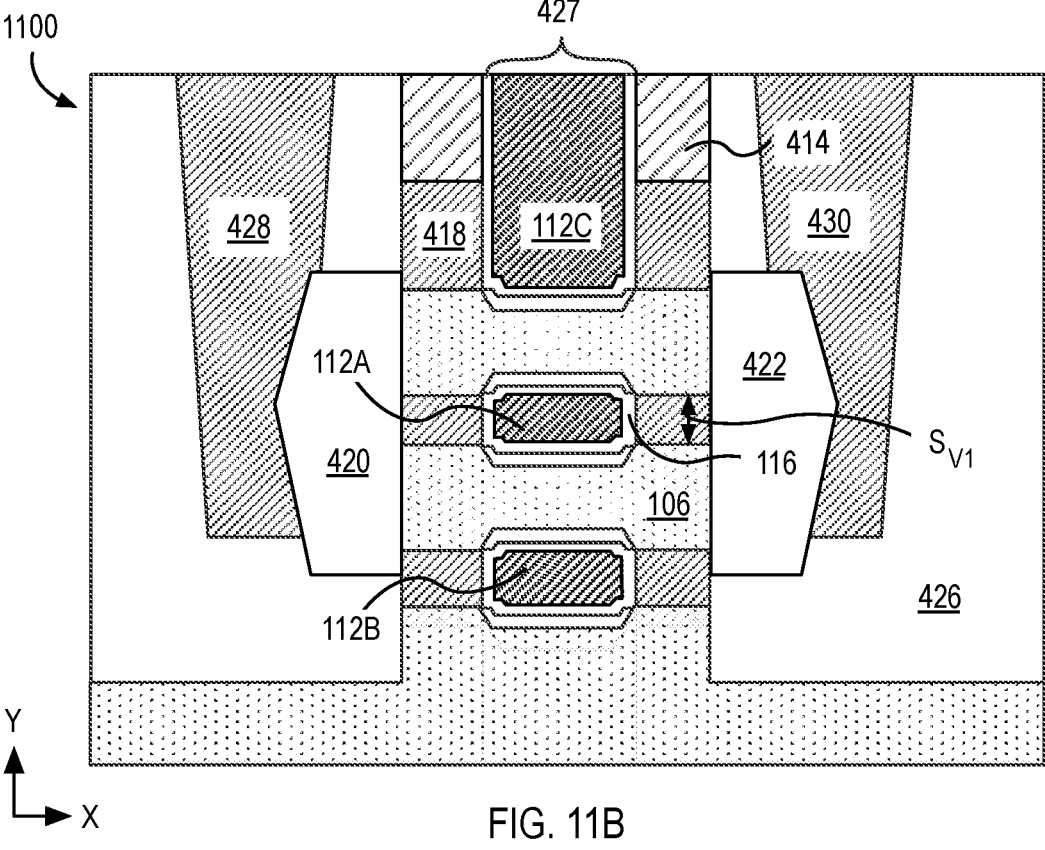
FIG. 11B illustrates the structure of FIG. 11A following the formation of a gate electrode on the second gate dielectric layer and following the formation of a source contact on the raised source structure and a drain contact on the raised drain structure.

FIG. 11B is a cross-sectional illustration of the structure in FIG. 11A following the process to form gate electrode. In an embodiment, a gate electrode layer material is deposited into the opening 427 on the gate dielectric layer 116 and on the gate dielectric layer 116 above the dielectric surface 426A. After deposition process, the gate electrode layer material is planarized, such as by a CMP process for example. The CMP process removes the gate dielectric layer 116 and excess gate electrode from above the dielectric surface 226A to form gate electrode 112.

In the illustrative embodiment, the gate electrode 112 is deposited by an ALD process to fill in regions between the channels 204 and 206 and between channel 206 and surface 102A. In exemplary embodiments, the gate electrode portion 112A formed between channel 204 and 206 has a thickness that is less than 10 nm but at least 2 nm. A thinner gate electrode portion between channels 204 and 206 advantageously reduces capacitance in the transistor. In some embodiments, the gate electrode 112 does not have sidewall portions that are vertical. In some such embodiments, the gate electrode 112 is pinched off due to a small vertical spatial separation distance, $S_{V1}$, (such as less than less than 10 nm) between channels 204 and 206.

Thus, formation of gate electrode 112 completes fabrication of an analog transistor that has one or more features of the transistors 200 such as recessed channels and dual gate dielectric layers.

After formation of gate electrode 112, a source contact 428 and a drain contact 430 may be formed on the source epitaxial structure 420, drain epitaxial structure 422, as is shown.

It is to be appreciated that nanowire transistors for logic application may be fabricated on the same substrate and share one or more processing operations as the recessed nanowire transistors for analog I/O applications. Logic transistors with no recess or substantially no recess in one or more channels may be co-fabricated with transistors for analog applications up to the process operation to remove the dummy gate structure in FIGS. 9A and 9B. In an embodiment, a plurality of openings is formed in the dielectric 426 to expose the source epitaxial structure 420 and drain epitaxial structure 422. The plurality of openings are filled with materials for a contact electrode and subsequently planarized off a top surface of the dielectric 426, dielectric spacer 414, gate electrode 112 and gate dielectric layer 116.

Figure 12:
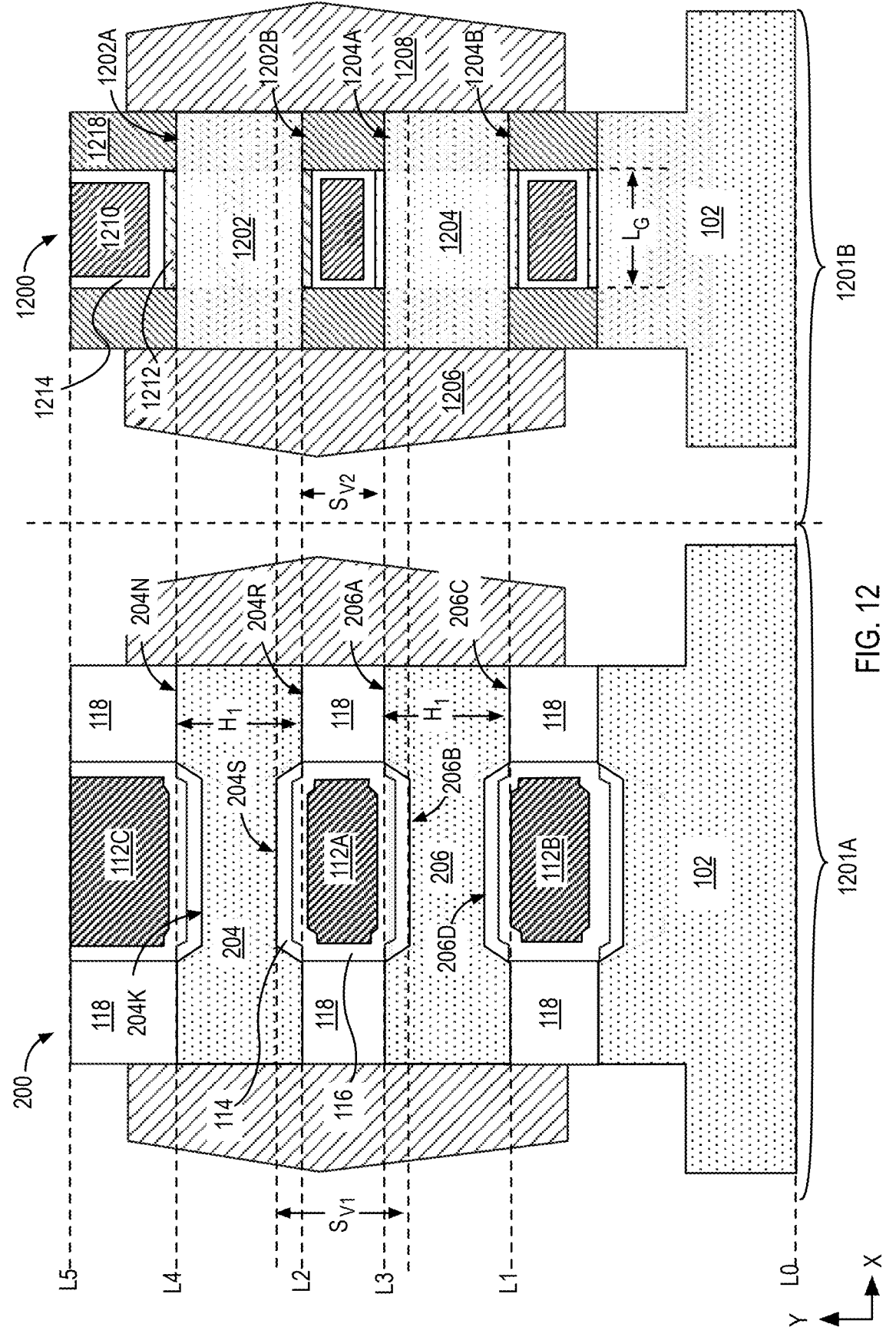
FIG. 12 is a cross sectional illustration of a first transistor including a plurality of recessed nanowires adjacent to a second transistor including the plurality of nanowires.

FIG. 12 is a cross-sectional illustration of a logic transistor 1200 directly adjacent to an analog transistor such as transistor 200 (described in association with FIG. 2A), on the substrate 102, in accordance with an embodiment of the present disclosure. In an embodiment, the analog transistor 200 is in an analog region 1201A and a logic transistor 1200 is in an adjacent logic region 1201B. The substrate 102 is at a level, L0, as shown. In an embodiment, the logic transistor 1200 includes a channel 1202 on a same plane as the channel 204, and a channel 1204 below channel 1202, where channel 1204 is on a same plane a channel 206. In the illustrative embodiment, channel 1204 is at level L1 and channel 1202 is at a level L2 above L1. In the illustrative embodiment, channel 1202 has a thickness, $H_1$, as measured from L2 that is, the same or substantially the same as the maximum thickness, $H_1$, of channel 204, and channel 1204 has a thickness, $H_1$, as measured from L1 is the same or substantially the same as the maximum thickness, $H_1$ of channel 206.

In the illustrative embodiment, channel 1202 has a substantially uniform thickness, $H_1$, along the longitudinal direction (X-direction), and the channel 1204 has a substantially uniform thickness, $H_1$ along the longitudinal direction.

In embodiments, the vertical separation $S_{V2}$ between a lowermost surface 1202B of channel 1202 and an uppermost surface 1204A of channel 1203 is substantially the same as a vertical separation between the lowermost surface 204R of channel 204 and an uppermost surface 206A of channel 206, as shown. In the illustrative embodiment, vertical separation $S_{V2}$ is a minimum vertical separation between surfaces 204R and 206A, and a minimum vertical separation between surfaces 1202B and 1204A. As shown, vertical separation $S_{V2}$ is also a maximum vertical separation between surfaces 1202B and 1204. On the contrary, a maximum vertical separation, $S_{V1}$ between surfaces 204S and 206B is greater than the maximum vertical separation, between surfaces 1202B and 1204A. A greater maximum vertical separation between surfaces 204S and 206B facilitates a greater thickness of gate dielectric layers 114 and 116 in transistor 200 compared to a total thickness of one or more gate dielectric layers in transistor 1200. In embodiments, $S_{V2}$ is at least 7 nm.

Transistor 1200 further includes an epitaxial source material 1206 coupled to a first end of channels 1202 and 1204 and an epitaxial drain material 1208 coupled to a second end of the channels 1202 and 1204, as shown.

The transistor 1200 includes a gate electrode 1210 between the epitaxial source material 1206 and the epitaxial drain material 1208, and around the channel 1202 and around channel 1204.

Transistor 1200 may have one or two gate dielectric layers between the gate electrode and the channels 1202 and 1204. In the in the illustrative embodiment, transistor 1200 includes a gate dielectric layer 1212 between the gate electrode 1210 and each of the channels 1202 and 1204 and a gate dielectric layer 1214 between the gate dielectric layer 1212 and the gate electrode 1210.

In an embodiment, the gate dielectric layer 1212 includes a material that is the same or substantially the same as material of the gate dielectric layer 114. In some such embodiments, gate dielectric layer 1212 includes silicon dioxide and gate dielectric layer 1212 has thickness that is less than 1 nm.

In a second embodiment, the gate dielectric layer 1212 includes a material that is the same or substantially the same as material of the gate dielectric layer 114, and gate dielectric layer 1214 includes a material that is the same or substantially the same as the material of the gate dielectric layer 116. In some such embodiments, gate dielectric layer 1212 includes silicon dioxide and gate dielectric layer 1212 has thickness that is less than 1 nm, and the gate dielectric layer 1214 includes HfO2 or ZrO2 and has a thickness that is less than 1 nm.

In a third embodiment, the gate dielectric layer 1212 includes a material that is the same or substantially the same as material of the gate dielectric layer 114, and gate dielectric layer 1214 includes a material that is the same or substantially the same as the material of the gate dielectric layer 116. In some such embodiments, gate dielectric layer 1212 includes silicon dioxide and gate dielectric layer 1212 has a thickness that is less than 1 nm, and the gate dielectric layer 1214 includes HfO2 or ZrO2 and has a thickness that is substantially the same as the thickness of the gate dielectric layer 116.

In a fourth embodiment, gate dielectric layer 1212 includes a material that is different from a material of the gate dielectric layer 114. In an embodiment, gate dielectric layer 1212 includes a first high-K material and gate dielectric 1214 includes a second high-K material. The combined thickness of the gate dielectric layers 1212 and 1214 may be between 1 nm and 1.5 nm.

In a fifth embodiment, gate dielectric layer 1212 includes a material that is different from a material of the gate dielectric layer 114. In an embodiment, gate dielectric layer 1212 includes a first high-K material and gate dielectric 1214 includes a material that is the same or substantially the same as the material of the gate dielectric layer 116. In some such embodiments, the combined thickness of the gate dielectric layers 1212 and 1214 may be between 1 nm and 1.5 nm.

In a sixth embodiment, the gate dielectric layer 1212 includes a material that is the same or substantially the same as material of the gate dielectric layer 114, but gate dielectric layer 1214 includes a material that is different from the material of the gate dielectric layer 116. In some such embodiments, gate dielectric layer 1212 includes silicon dioxide and has a thickness that is less than 1 nm and gate dielectric layer 1214 includes a high-k material.

In a fifth embodiment, transistor 1200 does not include gate dielectric layer 1212 but only gate dielectric layer 1214, where gate dielectric layer 1214 is a high-K material.

In other embodiments, where transistor 1200 does not include gate dielectric layer 1212 and where gate dielectric layer 1214 is the same or substantially the same as the material of the gate dielectric layer 116, the gate dielectric layer 1214 has a thickness that is less than or equal to a thickness of the gate dielectric layer 116.

As illustrated, channel 1204 has a lowermost surface 1204B that is at a same level (L1) with respect to L0, as the lowermost surface 206C of channel 206, and an uppermost surface 1204A that is at a same level (L3) with respect to L0, as the uppermost surface 206A of channel 206.

Also as illustrated, channel 1202 has a lowermost surface 1202B that is at a same level (L2) with respect to L0, as the lowermost surface 204R of channel 204, and an uppermost surface 1202A that is at a same level (L4) with respect to L0, as the uppermost surface 204N of channel 204.

It is to be appreciated that channels 1202 or 1204 have no surfaces that are substantially at a level of surfaces 206D or 206B of channel 206, or substantially at a level of surfaces 204K or 204S of channel 204.

In one or more embodiments, gate electrode 1202, includes a material that is the same or substantially the same as the material of gate electrode 112. In other embodiments, gate electrode 1210 includes a material that is different from a material of the gate electrode 112.

It is to be appreciated that portion of gate electrode 1210 above channel 1202 may have an uppermost surface that is at a level, L5, that is the same as an uppermost surface of the gate electrode portion 112C.

In one or more embodiments, the epitaxial source material 1206 includes a material that is the same or substantially the same as the material of the epitaxial source material 108 and epitaxial drain material 1208 includes a material that is the same or substantially the same as the material of the epitaxial drain material 110.

In an embodiment, the transistor 1200 includes a dielectric spacer 1218, where the dielectric spacer 1218 includes a material that is the same or substantially the same as the material of the dielectric spacer 118.

Figures 13A, 13B, 13C:
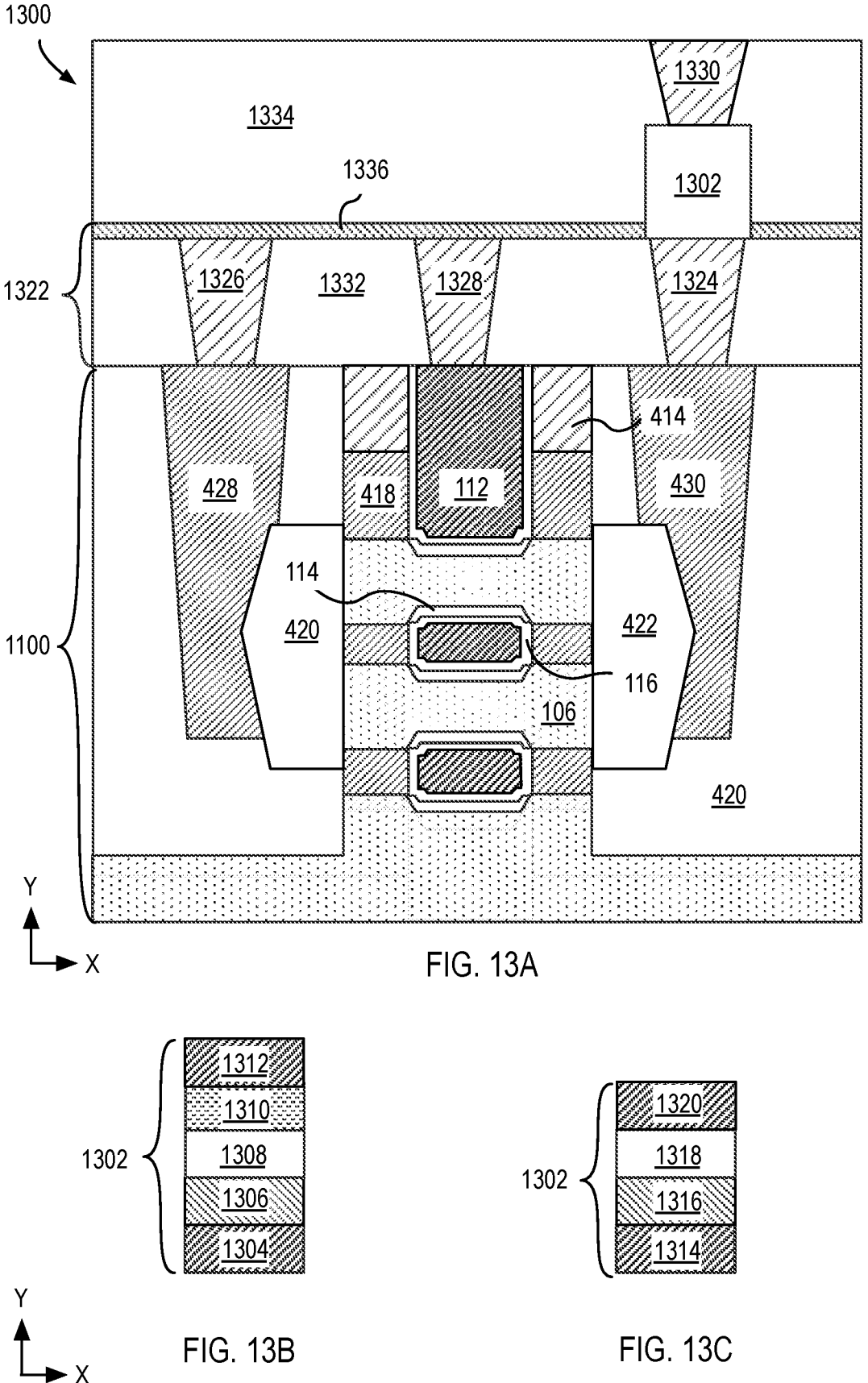
FIG. 13A is a cross-sectional illustration of a memory device coupled with a transistor including a plurality of recessed nanowires, in accordance with an embodiment of the present disclosure.
FIG. 13B is a cross-sectional illustration of a magnetic tunnel junction device, in accordance with an embodiment of the present disclosure.
FIG. 13C is a cross-sectional illustration of a resistive random-access memory device, in accordance with an embodiment of the present disclosure.

FIG. 13A illustrates a cross-sectional view of a memory cell 1300 including a nanowire transistor with a plurality of recessed channels, such as the transistor 4300 described in association with FIG. 11B and a non-volatile memory element 1302 coupled to a contact of the transistor 4300. In the illustrative embodiment, the non-volatile memory element 1302 is coupled to the drain contact 430 of the transistor 4300.

Non-volatile memory element 1302 may include a magnetic tunnel junction (MTJ) device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a transistor connected to an MTJ device can deliver an amount of current that exceeds critical switching current requirement of the MTJ device, then feature size scaling of MTJ devices can be relaxed. In an embodiment, transistor 4300, which can provide an additional current boost (through increase in drive current), can be advantageously coupled to non-volatile memory element 1302 such as an MTJ device to overcome any larger critical switching current requirements.

FIG. 13B illustrates a cross-sectional view of an example non-volatile memory element 1302 that includes a magnetic tunnel junction (MTJ) material device. In the illustrated embodiment, the MTJ device includes a bottom electrode 1304, a fixed magnet 1306 above the bottom electrode 1304, a tunnel barrier 1308 on the fixed magnet 1306, a free magnet 1310 on the tunnel barrier 1308, and a top electrode 1312 on the free magnet 1310. In an embodiment, a dielectric spacer laterally surrounds (not shown) non-volatile memory element 1302.

In an embodiment, fixed magnet 1306 includes a material and has a thickness sufficient for maintaining a fixed magnetization. For example, fixed magnet 1306 may include an alloy such as CoFe and CoFeB. In an embodiment, fixed magnet 1306 includes $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, fixed magnet 1306 is FeB, where the concentration of boron is between 10 and 40 atomic percent of the total composition of the FeB alloy. In an embodiment, the fixed magnet 1306 has a thickness that is between 1 nm and 2.5 nm.

In an embodiment, tunnel barrier 1308 is composed of a material suitable for allowing electron current having a majority spin to pass through tunnel barrier 1308, while impeding, at least to some extent, electron current having a minority spin from passing through tunnel barrier 1308. Thus, tunnel barrier 1308 (or spin filter layer) may also be referred to as a tunneling layer for electron current of a particular spin orientation. In an embodiment, tunnel barrier 1308 includes a material such as, but not limited to, magnesium oxide (MgO) or aluminum oxide ($Al_2O_{13}$). In an embodiment, tunnel barrier 1308 including MgO has a crystal orientation that is (001) and is lattice matched to free magnet 1310 below tunnel barrier 1308 and fixed magnet 1306 above tunnel barrier 1308. In an embodiment, tunnel barrier 1308 is MgO and has a thickness is between 1 nm to 2 nm.

In an embodiment, free magnet 1310 includes a magnetic material such as Co, Ni, Fe or alloys of these materials. In an embodiment, free magnet 1310 includes a magnetic material such as FeB, CoFe and CoFeB. In an embodiment, free magnet 1310 includes a $Co_{100-x-y}Fe_xB_y$, where X and Y each represent atomic percent such that X is between 50 and 80 and Y is between 10 and 40, and the sum of X and Y is less than 100. In an embodiment, X is 60 and Y is 20. In an embodiment, free magnet 1310 is FeB, where the concentration of boron is between 10 and 40 atomic percent of the total composition of the FeB alloy. In an embodiment, free magnet 1310 has a thickness that is between 1 nm and 2.0 nm.

In an embodiment, bottom electrode 1304 includes an amorphous conductive layer. In an embodiment, bottom electrode 1304 is a topographically smooth electrode. In an embodiment, bottom electrode 1304 includes a material such as W, Ta, TaN or TiN. In an embodiment, bottom electrode 1304 is composed of Ru layers interleaved with Ta layers. In an embodiment, bottom electrode 1304 has a thickness between 20 nm and 50 nm. In an embodiment, top electrode 1312 includes a material such as W, Ta, TaN or TiN. In an embodiment, top electrode 1312 has a thickness between 30 nm and 70 nm. In an embodiment, bottom electrode 1304 and top electrode 1312 are the same metal such as Ta or TiN. In an embodiment, the MTJ device has a combined total thickness of the individual layers is between 60 nm and 100 nm and a width is between 10 nm and 50 nm.

Referring again to FIG. 13A, in an embodiment, non-volatile memory element 1302 is a resistive random access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 4300, that can provide an additional current boost (through increase in drive current), can be advantageously coupled to an RRAM device to provide reliable switching operation.

FIG. 13C illustrates a cross-sectional view of an example non-volatile memory element 1302 that includes a resistive random-access memory (RRAM) device. In the illustrated embodiment, the RRAM material stack includes a bottom electrode 1314, a switching layer 1316 over the bottom electrode 1314, an oxygen exchange layer 1318 over the switching layer 1316, and a top electrode 1320 on the oxygen exchange layer 1318.

In an embodiment, bottom electrode 1314 includes an amorphous conductive layer. In an embodiment, bottom electrode 1314 is a topographically smooth electrode. In an embodiment, bottom electrode 1314 includes a material such as W, Ta, TaN or TiN. In an embodiment, bottom electrode 1314 is composed of Ru layers interleaved with Ta layers. In an embodiment, bottom electrode 1314 has a thickness is between 20 nm and 50 nm. In an embodiment, top electrode 1320 includes a material such as W, Ta, TaN or TiN. In an embodiment, top electrode 1320 has a thickness is between 130 and 70 nm. In an embodiment, bottom electrode 1314 and top electrode 1320 are the same metal such as Ta or TiN.

Switching layer 1316 may be a metal oxide, for example, including oxygen and atoms of one or more metals, such as, but not limited to Hf, Zr, Ti, Ta or W. In the case of titanium or hafnium, or tantalum with an oxidation state +4, switching layer 1316 has a chemical composition, $MO_X$, where O is oxygen and X is or is substantially close to 2. In the case of tantalum with an oxidation state +5, switching layer 1316 has a chemical composition, $M_2O_X$, where O is oxygen and X is or is substantially close to 5. In an embodiment, switching layer 1316 has a thickness is between 1 nm and 5 nm.

Oxygen exchange layer 1318 acts as a source of oxygen vacancy or as a sink for $O^{2-}$. In an embodiment, oxygen exchange layer 1318 is composed of a metal such as but not limited to, hafnium, tantalum or titanium. In an embodiment, oxygen exchange layer 1318 has a thickness is between 5 nm and 20 nm. In an embodiment, the thickness of oxygen exchange layer 1318 is at least twice the thickness of switching layer 1316. In another embodiment, the thickness of oxygen exchange layer 1318 is at least twice the thickness of switching layer 1316. In an embodiment, the RRAM device has a combined total thickness of the individual layers is between 60 nm and 100 nm and width is between 10 nm and 50 nm.

Referring again to FIG. 13, the memory device 1302 is coupled to the transistor 4300 through interconnect structures at a level 1322 above the transistor. In an embodiment, level 1322 includes a single level of interconnects coupled with the transistor 1100. In other embodiments, level 1322 includes a plurality of sublevels of interconnect routing structures.

In the illustrative embodiment, the memory cell 1300 includes a drain interconnect 1324 between the memory device 1302 and the drain contact 430. As shown, the drain interconnect 1324 is on and coupled with the drain contact 430. The memory cell 1300 further includes a source interconnect 1326 coupled with the source contact 428 and gate interconnect 1328 coupled with the gate 112. In other embodiments, a gate contact is between the gate 112 and the gate interconnect 1328. The memory device 1302 is further coupled to a memory interconnect 1330.

In an embodiment, source interconnect 1326, gate interconnect 1328 and drain interconnect 1324 are embedded in a dielectric layer 1332. In an embodiment, the source interconnect 1326, gate interconnect 1328, drain interconnect 1324 and memory interconnect 1330 each include titanium, tantalum, tungsten, ruthenium, copper, or nitrides of titanium, tantalum, tungsten, ruthenium. In other embodiments the source interconnect 1326, gate interconnect 1328, drain interconnect 1324 and memory interconnect 1330, include a liner layer including ruthenium or tantalum and a fill metal such as copper or tungsten. In the illustrative embodiment, the memory device 1302 and the memory interconnect 1330 is embedded in a dielectric 1334.

In an embodiment, the level 1322 further includes a barrier dielectric layer 1336 between the dielectric 1332 and dielectric 1334. In embodiments dielectric 1332 and 1334 include silicon and one or more of nitrogen, oxygen and carbon such as, silicon nitride, silicon dioxide, carbon doped silicon nitride, silicon oxynitride or silicon carbide.

In embodiments, dielectric 1336 includes silicon and one or more of nitrogen and carbon such as, silicon nitride, carbon doped silicon nitride or silicon carbide.

Figure 14:
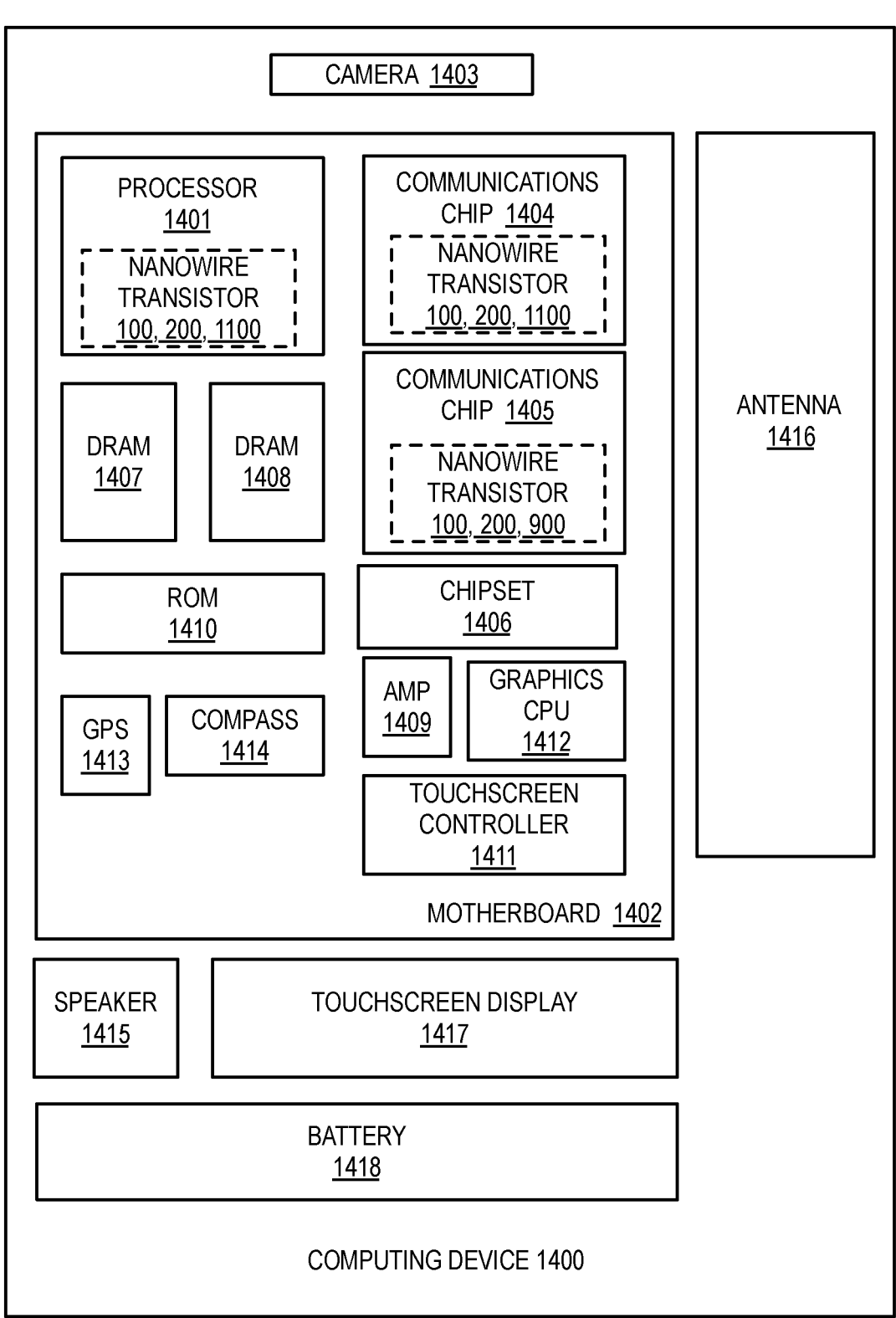
FIG. 14 illustrates a computing device in accordance with embodiments of the present disclosure.

FIG. 14 illustrates a computing device 1400 in accordance with embodiments of the present disclosure. As shown, computing device 1400 houses a motherboard 1402. Motherboard 1402 may include a number of components, including but not limited to a processor 1401 and at least one communications chip 1404 or 1405. Processor 1401 is physically and electrically coupled to the motherboard 1402. In some implementations, communications chip 1405 is also physically and electrically coupled to motherboard 1402. In further implementations, communications chip 1405 is part of processor 1401.

Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset 1406, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1405 enables wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1405 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1400 may include a plurality of communications chips 1404 and 1405. For instance, a first communications chip 1405 may be dedicated to shorter range wireless communications such as Wi-Fi and Bluetooth and a second communications chip 1404 may be dedicated to longer range wireless communications such as GPS, EDGE, GPRS, CDMA, WiMAX, LTE, Ev-DO, and others.

Processor 1401 of the computing device 1400 includes an integrated circuit die packaged within processor 1401. In some embodiments, the integrated circuit die of processor 1401 includes one or more interconnect structures, non-volatile memory devices, and transistors such as recessed nanowire transistors 100, 200 or 1100 FIG. 1A, 2A or 11B, respectively. Referring again to FIG. 14, the term "processor" may refer to any device or portion of a device that processes electronic data from registers and/or memory to transform that electronic data into other electronic data that may be stored in registers and/or memory.

Communications chip 1405 also includes an integrated circuit die packaged within communication chip 1405. In another embodiment, the integrated circuit die of communications chips 1404, 1405 includes one or more interconnect structures, non-volatile memory devices, capacitors and transistors such as recessed nanowire transistors 100, 200 or 1100, described above. Depending on its applications, computing device 1400 may include other components that may or may not be physically and electrically coupled to motherboard 1402. These other components may include, but are not limited to, volatile memory (e.g., DRAM) 1407, 1408, non-volatile memory (e.g., ROM) 1410, a graphics CPU 1412, flash memory, global positioning system (GPS) device 1413, compass 1414, a chipset 1406, an antenna 1416, a power amplifier 1409, a touchscreen controller 1411, a touchscreen display 1417, a speaker 1415, a camera 1403, and a battery 1418, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1400 and discussed above may contain a stand-alone integrated circuit memory die that includes one or more arrays of NVM devices.

In various implementations, the computing device 1400 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Figure 15:
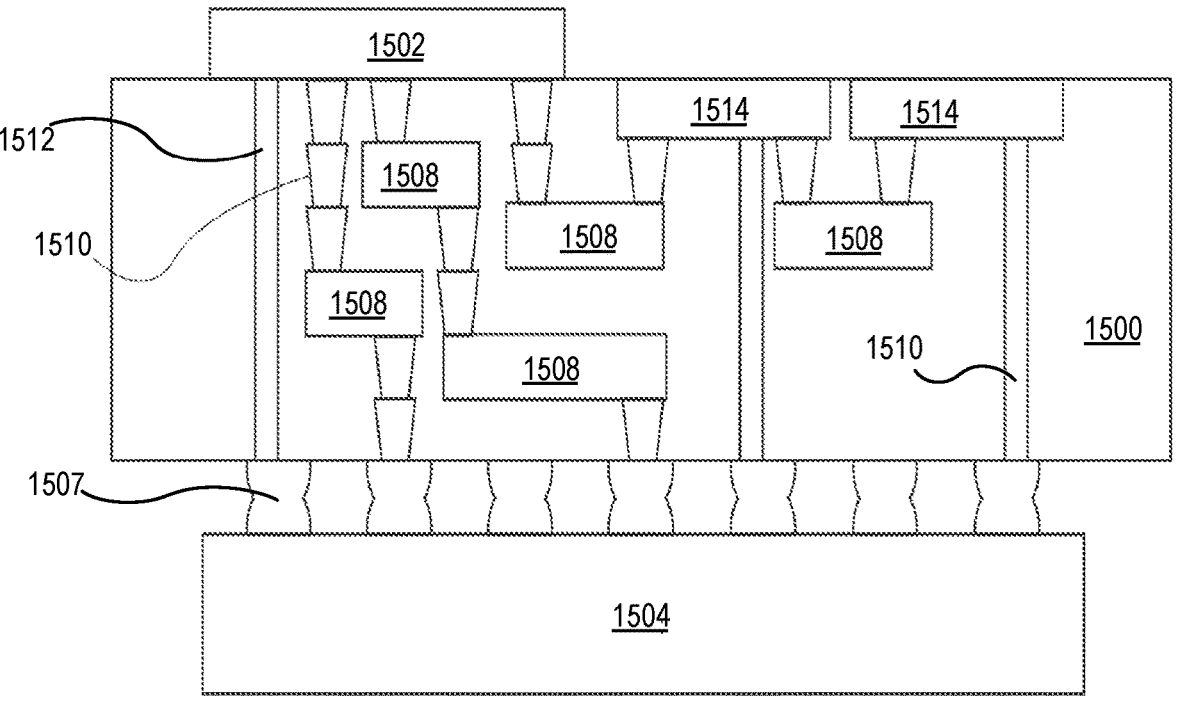
FIG. 15 illustrates an integrated circuit (IC) structure that includes one or more embodiments of the present disclosure.

FIG. 15 illustrates an integrated circuit (IC) structure 1500 that includes one or more embodiments of the disclosure. The integrated circuit (IC) structure 1500 is an intervening substrate used to bridge a first substrate 1502 to a second substrate 1504. The first substrate 1502 may be, for instance, an integrated circuit die. The second substrate 1504 may be, for instance, a memory module, a computer mother, or another integrated circuit die. Generally, the purpose of an integrated circuit (IC) structure 1500 is to spread a connection to a wider pitch or to reroute a connection to a different connection. For example, an integrated circuit (IC) structure 1500 may couple an integrated circuit die to a ball grid array (BGA) 1507 that can subsequently be coupled to the second substrate 1504. In some embodiments, the first substrate 1502 and the second substrate 1504 are attached to opposing sides of the integrated circuit (IC) structure 1500. In other embodiments, the first substrate 1502 and the second substrate 1504 are attached to the same side of the integrated circuit (IC) structure 1500. And in further embodiments, three or more substrates are interconnected by way of the integrated circuit (IC) structure 1500.

The integrated circuit (IC) structure 1500 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1508 and vias 1510, including but not limited to through-silicon vias (TSVs) 1512. The integrated circuit (IC) structure 1500 may further include embedded devices 1514, including both passive and active devices. Such embedded devices 1514 include capacitors, decoupling capacitors, resistors, inductors, fuses, diodes, transformers, device structure including transistors, such as recessed nanowire transistors 100, 200 or 1100 as described in FIG. 1A, 2A or 11B, respectively. Referring again to FIG. 15, the integrated circuit (IC) structure 1500 may further include embedded devices 1514 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 1500.

Thus, one or more embodiments of the present disclosure relate to recessed nanowire transistors such as 100, 200 or 1100 as described above. The recessed nanowire transistors 100, 200 or 1100 may be used in various integrated circuit applications.

In a first example, a transistor structure includes a first channel layer over a second channel layer, where the first and the second channel layers include monocrystalline silicon. An epitaxial source material is coupled to a first end of the first and second channel layers. An epitaxial drain material is coupled to a second end of the first and second channel layers, a gate electrode is between the epitaxial source material and the epitaxial drain material, and around the first channel layer and around the second channel layer. The transistor structure further includes a first gate dielectric layer between the gate electrode and each of the first channel layer and the second channel layer, where the first gate dielectric layer has a first dielectric constant. A second gate dielectric layer is between the first gate dielectric layer and the gate electrode, where the second gate dielectric layer has a second dielectric constant.

In second examples, for any of first examples, the second dielectric constant is at least 5 times greater than the second dielectric constant.

In third examples, for any of the first through second examples, the second dielectric constant is at least 20.

In fourth examples, for any of the first through third examples, the first gate dielectric layer includes a thickness between 1.6 nm and 2.2 nm and where the second gate dielectric layer includes a thickness less than 2.0 nm.

In fifth examples, for any of the first through fourth examples, the sum of the thickness of the first gate dielectric layer and the second gate dielectric layer is less than 4 nm.

In sixth examples, for any of the first through fifth examples, a vertical spacing between a lowermost surface of the first channel layer and an uppermost surface the second channel layer is at least 8 nm.

In seventh examples, for any of the first through sixth examples, the first channel and the second channel each include a cross sectional area orthogonal to the direction between the epitaxial source material and the epitaxial drain material, where the cross-sectional area is at least 30 squared nanometer, and where the first channel and the second channel each include a minimum thickness of at least 10 nm.

In eighth examples, a transistor structure includes a first channel layer over a second channel layer. The first and the second channel layers include a first tapered section decreasing in thickness from a first thickness to a second thickness along a longitudinal direction, a second tapered section increasing in thickness from the second thickness to the first thickness along the longitudinal direction and a bridge section between the first and the second tapered sections, the bridge section including substantially the second thickness. The transistor structure also includes an epitaxial source material coupled to a first end of the first and second channel layers, an epitaxial drain material coupled to a second end of the first and second channel layers, a gate electrode between the source material and the drain material, and around the first channel layer and the second channel layer, a first gate dielectric layer between the gate electrode and each of the first channel layer and the second channel layer, the first gate dielectric layer having a first dielectric constant and a second gate dielectric layer between the first gate dielectric layer and the gate electrode, where the second gate dielectric layer includes a second dielectric constant.

In ninth examples, for any of the eighth example, the first thickness is at least 10 nm and the second thickness is between 5 nm and 10 nm.

In tenth examples, for any of the eighth through ninth examples, the first and second tapered sections span a lateral distance along a longitudinal length of the first channel layer or the second channel layer, where the lateral distance is between 2 nm and 10 nm.

In eleventh examples, for any of the eighth through tenth examples, the bridge section spans a lateral distance that is 90% greater than the lateral distance of each of the first or the second tapered sections.

In twelfth examples, for any of the eighth through eleventh examples, a vertical separation between a bottom surface of the bridge section of the first channel and a top surface of the bridge section of the second channel is at least 10 nm.

In thirteenth examples, for any of the eighth through twelfth examples, a vertical separation between a lowermost surface of the first channel and an uppermost surface of the second channel is a minimum vertical separation and where the minimum vertical separation is at least 7 nm.

In a fourteenth example, for any of the eighth through thirteenth examples, the first gate dielectric layer has a thickness between X nm and Y nm and where the second gate dielectric layer has a thickness less than 2 nm and where the sum of the thickness of the first gate dielectric layer and the second gate dielectric layer is less than 4 nm.

In fifteenth examples, for any of the eighth through fourteenth examples, the transistor structure is a first transistor, where the gate electrode is a first gate electrode, and where the first transistor is adjacent to a second transistor. The second transistor includes a third channel layer on a same plane as the first channel layer and a fourth channel layer on a same plane as the second channel layer, where the third channel layer is over a fourth channel layer, where the third and the fourth channel layers include the second thickness. The second transistor further includes an epitaxial source material coupled to a first end of the third and fourth channel layers, an epitaxial drain material coupled to a second end of the third and fourth channel layers, a second gate electrode between the epitaxial source material and the epitaxial drain material, and around the third channel layer and around the fourth channel layer and a third gate dielectric layer between the gate electrode and each of the third channel layer and the fourth channel layer, the third gate dielectric layer having a third dielectric constant.

In sixteenth examples, for any of the eighth through fifteenth examples, the second transistor further includes a fourth gate dielectric layer between the third gate dielectric layer and the second gate electrode, the fourth gate dielectric layer including a fourth dielectric constant and where the first gate dielectric layer has a thickness that is greater than a thickness of the third gate dielectric layer, and where the second gate dielectric layer includes a same material as the material of the third gate dielectric layer, and where the third dielectric constant is the same or substantially the same as the second dielectric constant.

In seventeenth examples, for any of the eighth through sixteenth examples, a vertical separation between a lowermost surface of the first channel and an uppermost surface of the second channel is substantially the same as a vertical separation between a lowermost surface of the third channel and an uppermost surface of the fourth channel and where the vertical separation is at least 8 nm.

In eighteenth examples, a method of fabricating a transistor includes forming a material layer stack including a layer of sacrificial material on a plurality of bilayers, where each bilayer is formed by depositing a channel layer including a monocrystalline silicon on a layer of the sacrificial material. The method further includes patterning the material layer stack into a block, forming a dummy gate over a first portion of the block and forming a dielectric spacer adjacent the dummy gate and adjacent to the block, where the first dielectric includes a first portion adjacent to one sidewall of the dummy gate and a second portion adjacent to a second sidewall of the dummy gate, the second sidewall opposite to the first sidewall. The method further includes etching the material layer stack adjacent to the dielectric spacer, forming epitaxial source structure adjacent to a first end of the first and second channel layers and an epitaxial drain structure adjacent to a second end of the first and second channel layers and etching and removing the dummy gate and removing the sacrificial material from the material layer stack to form a first suspended channel over a second suspended channel The method further includes recessing one or more surfaces of each of the first suspended channel and of the second suspended channel, forming a first gate dielectric layer on each of the first suspended channel and the second suspended channel, forming a second gate dielectric on the first gate dielectric layer, forming a gate electrode on the second gate dielectric layer and forming a first contact adjacent to the epitaxial source structure and a second contact adjacent to the second epitaxial source structure.

In nineteenth examples, for any of the eighteenth example, recessing the one or more surfaces of the first suspended channel and of the second suspended channel includes vertically recessing upper and/or lower most surfaces and laterally recessing one or more sidewall surfaces.

In twentieth example, for any of the eighteenth through nineteenth examples, forming the first gate dielectric includes growing a silicon dioxide on surfaces of the first suspended channel and second suspended channel and forming the second gate dielectric layer includes depositing a material including a higher dielectric constant than a dielectric constant of the first gate dielectric layer.

What is claimed is:

1. An apparatus, comprising:
  a first transistor structure, comprising:
    a stack of a plurality of first channel structures, wherein each of the first channel structures comprises silicon, wherein the first channel structures each comprise a first section decreasing in thickness from a first thickness to a second thickness along a longitudinal direction, and a second section increasing in thickness from the second thickness to the first thickness along the longitudinal direction, wherein the second thickness in adjacent ones of the first channel structures have a first vertical separation therebetween, and wherein the first thickness in adjacent ones of the first channel structures have a second vertical separation therebetween, smaller than the first vertical separation;
    a source material and a drain material coupled to opposite ends of the first channel structures;
    a gate electrode material between the source material and the drain material, and within the first vertical separation; and
    a first thickness of gate dielectric material within the first vertical separation and between the gate electrode material and each of the first channel structures; and
  a second transistor structure, comprising:
    a stack of a plurality of second channel structures with the second vertical separation, wherein each of the second channel structures comprises silicon and wherein the second channel structures have substantially the first thickness in an absence of the first and second sections;

a source material and a drain material coupled to opposite ends of the second channel structures;
a gate electrode material between the source material and the drain material within the second vertical separation; and
a second thickness of gate dielectric material within the second vertical separation and between the gate electrode material and each of the second channel structures, wherein the second thickness of gate dielectric material is less than the first thickness of gate dielectric material, and wherein:
the first thickness of gate dielectric material comprises a first dielectric material layer in contact with the first channel structures and a third dielectric material layer in contact with the first dielectric material layer;
the second thickness of gate dielectric material comprises a second dielectric material layer in contact with the first channel structures and a fourth dielectric material layer in contact with the second dielectric material layer, the fourth dielectric material layer having substantially the same composition and substantially the same thickness as the third dielectric material layer; and
the first dielectric material layer and the second dielectric material layer have substantially the same composition.

2. The apparatus of claim 1, wherein the first dielectric material layer and the second dielectric material layer both comprise silicon and oxygen.

3. The apparatus of claim 1, wherein the first dielectric material layer is thicker than the second dielectric material layer.

4. The apparatus of claim 3, wherein the first dielectric material layer has a thickness over 1.5 nm and the second dielectric material layer has a thickness less than 1 nm.

5. The apparatus of claim 1, wherein the third dielectric material layer and the fourth dielectric material layer both comprise a metal and oxygen.

6. The apparatus of claim 1, wherein:
the first vertical separation is between a lowermost surface of an upper one of the first channel structures and an uppermost surface of a lower one of the first channel structures;
the second vertical separation is between an upper one of the second channel structures and an uppermost surface of a lower one of the second channel structures; and
the second vertical separation is at least 7 nm.

7. The apparatus of claim 1, wherein the first channel structures each comprise a bridge section between the first and the second sections, the bridge section having substantially the second thickness.

8. An apparatus, comprising:
  a first transistor structure, comprising:
    a stack of a plurality of first channel structures, wherein each of the first channel structures comprises silicon and has a first section decreasing in thickness from a first thickness to a second thickness along a longitudinal direction, and a second section increasing in thickness from the second thickness to the first thickness along the longitudinal direction;
    a source material and a drain material coupled to opposite ends of the first channel structures;
    a gate electrode material between the source material and the drain material; and
    a first thickness of gate dielectric material between the gate electrode material and each of the first channel structures; and
  a second transistor structure, comprising:

a stack of a plurality of second channel structures, wherein each of the second channel structures comprises silicon, and lacks the first and second sections;

a source material and a drain material coupled to opposite ends of the second channel structures;

a gate electrode material between the source material and the drain material;

a second thickness of gate dielectric material between the gate electrode material and each of the second channel structures, wherein the second thickness of gate dielectric material is less than the first thickness of gate dielectric material, and wherein:

the first thickness of gate dielectric material comprises a first dielectric material layer in contact with the first channel structures;

the second thickness of gate dielectric material comprises a second dielectric material layer in contact with the second channel structures;

the first thickness of gate dielectric material comprises a third dielectric material layer in contact with the first dielectric material layer;

the second thickness of gate dielectric material comprises a fourth dielectric material layer in contact with the second dielectric material layer;

the third dielectric material layer and the fourth dielectric material layer comprises a metal and oxygen; and the third dielectric material layer has substantially the same thickness as the fourth dielectric material layer.

9. The apparatus of claim 8, wherein the second channel structures have substantially the first thickness over an entire distance between the source material and the drain material.

10. The apparatus of claim 8, wherein:

the first dielectric material layer and the second dielectric material layer have substantially the same composition.

11. The apparatus of claim 10, wherein the first dielectric material layer and the second dielectric material layer both comprise silicon and oxygen.

12. The apparatus of claim 10, wherein the first dielectric material layer is thicker than the second dielectric material layer.

13. The apparatus of claim 10, wherein the third dielectric material layer and the fourth dielectric material layer have substantially the same composition.

14. The apparatus of claim 8, wherein a first vertical separation between a lowermost surface of an upper one of the first channel structures and an uppermost surface of a lower one of the first channel structures is greater than a second vertical separation between an upper one of the second channel structures and an uppermost surface of a lower one of the second channel structures.

* * * * *